United States Patent
Ma et al.

(10) Patent No.: US 12,418,734 B2
(45) Date of Patent: Sep. 16, 2025

(54) GLOBAL SHUTTER PIXEL WITH VERTICALLY INTEGRATED MULTI-PHASE CHARGE TRANSFER

(71) Applicant: Apple Inc., Cupertino, CA (US)

(72) Inventors: Jiaju Ma, Arcadia, CA (US); Arnaud Laflaquiere, Paris (FR)

(73) Assignee: Apple Inc., Cupertino, CA (US)

( * ) Notice: Subject to any disclaimer, the term of this patent is extended or adjusted under 35 U.S.C. 154(b) by 189 days.

(21) Appl. No.: 18/326,940

(22) Filed: May 31, 2023

(65) Prior Publication Data

US 2024/0236525 A1 Jul. 11, 2024

Related U.S. Application Data

(60) Provisional application No. 63/479,533, filed on Jan. 11, 2023.

(51) Int. Cl.
*H04N 25/75* (2023.01)

(52) U.S. Cl.
CPC ................................ *H04N 25/75* (2023.01)

(58) Field of Classification Search
None
See application file for complete search history.

(56) References Cited

U.S. PATENT DOCUMENTS

| 6,046,466 | A | * | 4/2000 | Ishida | ............... H01L 27/14609 |
| | | | | | 348/E5.037 |
| 8,274,587 | B2 | | 9/2012 | Hynecek | |
| 2020/0068155 | A1 | * | 2/2020 | Kitano | ................. H04N 25/77 |
| 2021/0296378 | A1 | | 9/2021 | Fukui et al. | |
| 2021/0408096 | A1 | | 12/2021 | Shimizu | |
| 2022/0320174 | A1 | | 10/2022 | Yang et al. | |

FOREIGN PATENT DOCUMENTS

| CN | 104241311 | 12/2014 |
| WO | 2009066909 | 5/2009 |

OTHER PUBLICATIONS

International Search Report and Written Opinion from PCT.US2023/086492, dated Mar. 25, 2024, pp. 1-14.

\* cited by examiner

*Primary Examiner* — Mark T Monk
(74) *Attorney, Agent, or Firm* — Robert C. Kowert; Kowert, Hood, Munyon, Rankin & Goetzel, P.C.

(57) ABSTRACT

An image sensor may include a plurality of pixels, each of which may include a photodiode having a charge accumulation region ("PD"), a floating diffusion region ("FD"), and a charge transfer region vertically between the PD and FD. The vertical charge transfer region may include a first charge modulation region ("P1"), a second charge modulation region ("P2"), and a third charge modulation region ("P3"). The image sensor may operate in a global shutter mode, in which the P2 may be used as an in-pixel charge memory region to temporarily store charge during transfer of the charge from PD to FD via P1, P2, and P3.

20 Claims, 19 Drawing Sheets

FIG. 5B

GLOBAL SHUTTER PIXEL WITH VERTICALLY INTEGRATED MULTI-PHASE CHARGE TRANSFER

This application claims benefit of priority of U.S. Provisional Application Ser. No. 63/479,533, entitled "Global Shutter Pixel with Vertically Integrated Multi-Phase Charge Transfer", filed Jan. 11, 2023, which is hereby incorporated in reference herein in its entirety.

BACKGROUND

Technical Field

This disclosure relates generally to an image sensor and more specifically to pixels of an image sensor having vertically integrated multi-phase charge transfer for image capturing in a global shutter mode.

Description of the Related Art

Image capturing devices, such as cameras, are widely used in various electronic devices, such as mobile devices (e.g., smart phones, tablets, laptops, etc.), robotic equipment, or security monitoring devices, among others. An image capturing device may include an image sensor having a plurality of light-gathering pixels. Each pixel may include a photodiode. The image capturing device may capture light from an environment and pass the light to the image sensor. When exposed to light, photodiodes of the pixels may accumulate electrical charge. At readout, the electrical charge of the photodiodes may be read out of the photodiodes, using one or more transistors, to generate analog image signals. The analog image signals may be converted to digital signals and further processed to produce images.

BRIEF DESCRIPTION OF THE DRAWINGS

FIG. 5B shows example control signals applied to different components of a plurality of pixels of an image sensor, according to some embodiments.

Figure 1:
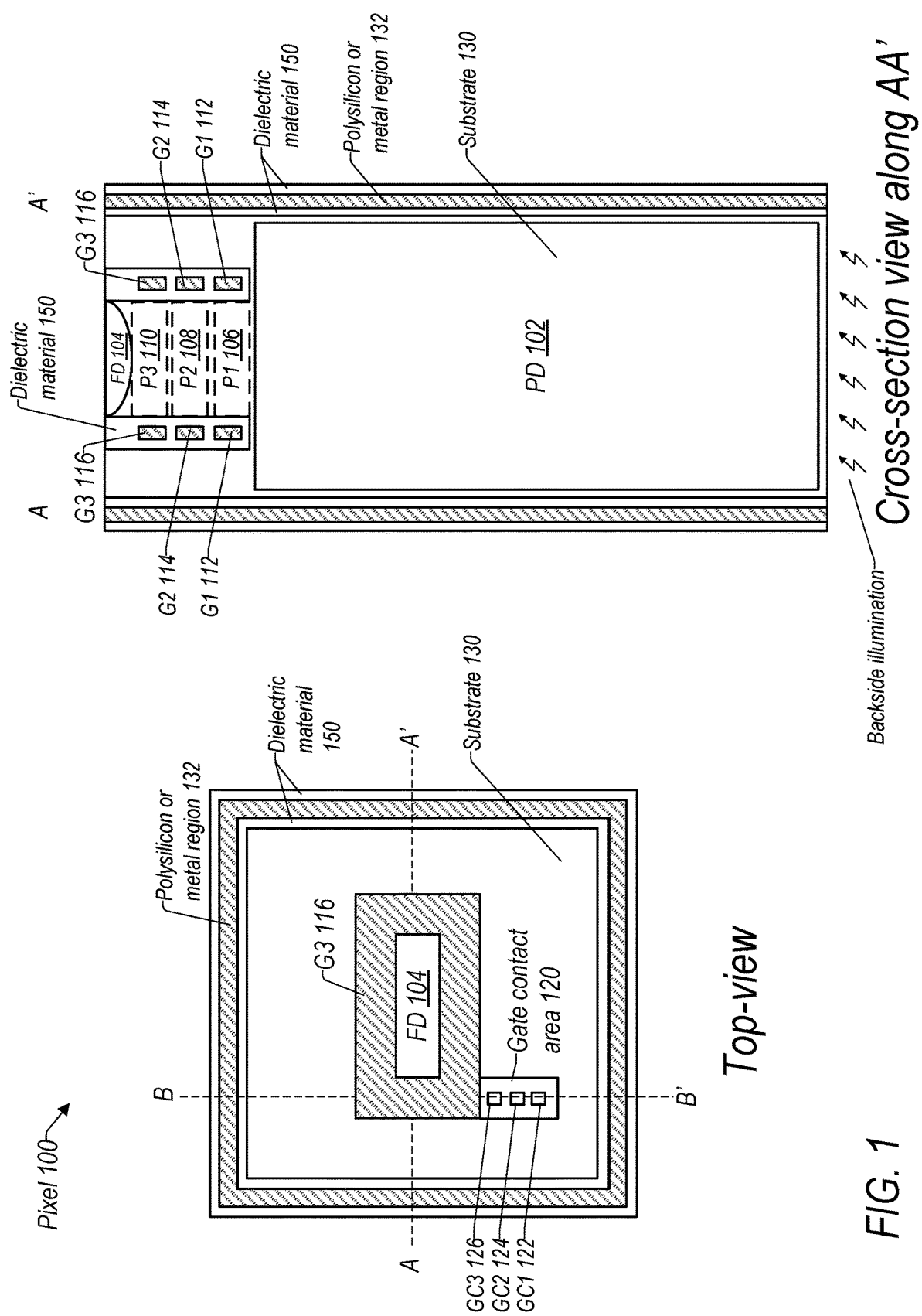
FIG. 1 shows top view and cross-section view of an example pixel of an image sensor, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments described herein relate to an image sensor operating in a global shutter mode. In some embodiments, the image sensor may include a plurality of light-gathering pixels, e.g., organized in a pixel array having one or more rows and one or more columns of pixels. In some embodiments, the image sensor may be a CMOS (Complementary Metal Oxide Semiconductor) image sensor, a CCD (charge-coupled device) image sensor, and the like. In some embodiments, the image sensor may be part of an image capturing device, e.g., a camera, which further may be part of an electronic device, e.g., a mobile device (e.g., smart phones, tablets, laptops, etc.), robotic equipment, or a security monitoring device, among others. In some embodiments, the pixels of the image sensor may each include at least one photodiode comprising a charge accumulation region (hereinafter "PD"), a floating diffusion region (hereinafter "FD"), and a charge transfer region vertically between the PD and FD. When exposed to light, for each pixel, the PD may accumulate charge or photo-carriers. At readout, at least some of the charge may be transferred from the PD to the FD to generate an analog image signal (e.g., an analog voltage) at the FD, which may be further accessed at a pixel output line outside the pixel. In some embodiments, the analog image signals accessed through pixel output lines may be further processed, e.g., analog-to-digital converted using analog-to-digital converter(s) and digitally processed by an image signal processor (ISP), to generate one or more images.

Generally, a given image capturing device may operate in a rolling shutter mode or a global shutter mode. In rolling shutter, different lines of the pixel array of the image sensor of the image capturing device may be exposed to light at different times as the read out "wave" sweeps through the image sensor. For example, the pixels of a pixel array may be exposed and image signals of the pixels may be read out sequentially, e.g., row-by-row from the top to the bottom of the pixel array. For example, pixels of the same row may be read out at the same time, whereas pixels in the same column but different rows may be read out sequentially one by one. Thus, in rolling shutter, the image sensor may record an image row-by-row sequentially instead of capturing the entire image at once. By comparison, in global shutter, all the pixels may have the same exposure time, meaning that each pixel in the image sensor may begin and end exposure simultaneously. As a result, the entire image may be recorded at once. The rolling shutter can cause color and/or shade variation in the captured images, since different "lines" of the image are recorded at different times. In some application, e.g., in high-speed photographing or recording, this can cause severe distractions and greatly affect qualities of the captured images. Thus, in some embodiments, global shutter may be preferred. However, in some embodiments, even though the pixels of an image sensor end exposure simultaneously, their image signals may still be read out sequentially, e.g., row-by-row, like the rolling shutter. Thus, the image sensor may need "memory" to temporarily store (a) the charge (e.g., in the charge domain) and/or (b) the analog or digital image signals (e.g., in the voltage domain) of the pixels at the end of exposure until readout of the individual pixels.

To solve the problem, in some embodiments, the pixels of the image sensor disclosed herein may each include an in-pixel charge memory region. At the end of exposure, the charge may be transferred from the PD to the in-pixel charge memory region. The charge may be temporarily stored there until readout of the pixel. At the readout, the charge may be transferred from the in-pixel charge memory region to the FD, from which analog image information may be further accessed through a pixel output line. One with skills in the art shall understand that the disclosed image sensor can provide several benefits. First, it can provide an in-pixel charge memory region for each pixel to temporarily store the pixel's charge, thus enabling an image sensor to operate in a global shutter mode. In addition, the "memory" is integrated as part of the pixel to store the charge inside the pixel, thus eliminating or at least reducing other additional memory storage components (e.g., memory chips on the image sensor, etc.). As a result, this may reduce the number of components for an image sensor, reduce the image sensor's footprint, and/or increase the sensor's pixel density.

FIG. 1 shows top and cross-section view of an example pixel of an image sensor, according to some embodiments. As shown in the figure, in some embodiments, pixel 100 may be formed on or in substrate 130, e.g., a substrate made of silicon or other semiconductor materials. In some embodiments, pixel 100 may be one of a plurality of pixels of an image sensor (e.g., a CMOS image sensor, a CCD image sensor, and the like) of an image capturing device. In some embodiments, pixel 100 may include one or more circuits (e.g., a pixel readout circuit) formed using one or more transistors for reading out the image signals from pixel 100 to generate one or more analog signals (e.g., analog voltages) at a pixel output line, and/or other signal conditioning or processing circuit(s). For purposes of illustration, the circuits are not shown in FIG. 1.

As shown in FIG. 1, in some embodiments, pixel 100 may include at least one photodiode comprising a charge accumulation region 102 (hereinafter "PD"), a floating diffusion region 104 (hereinafter "FD"), and at least one charge transfer region formed vertically between PD 102 and FD 104. As shown in FIG. 1, in some embodiments, PD 102 and FD 104 may be disposed vertically one relative to another, e.g., with PD 102 placed underneath and at least partially overlapping FD 104, and FD 104 placed proximate the top surface of pixel 100. In addition, in some embodiments, the at least one charge transfer region may include multiple charge modulation regions, e.g., a phase 1 charge modulation region 106 (hereinafter "P1"), a phase 2 charge modulation region 108 (hereinafter "P2"), and a phase 3 charge modulation region 110 (hereinafter "P3"). As shown in FIG. 1, in some embodiments, P1 106, P2 108, and P3 110 may be disposed vertically one on top of another between PD 102 and FD 104. For example, P1 106 may be formed above and at least partially overlapping PD 102, P2 108 may be formed above and at least partially overlapping P1 106, and P3 110 may be formed (a) above and at least partially overlapping P2 108 and (b) underneath and at least partially overlapping FD 104. As a result, P1 106, P2 108, and P3 110 may be stacked together and collectively form the charge transfer region vertically between PD 102 and FD 104. In some embodiments, at least a portion of P3 110 may optionally be disposed away and separated from FD 104 by a physical gap. For example, in some embodiments, the physical gap may be located at the top corners of P3 110 interfacing FD 104. The physical gap may provide a potential barrier (e.g., an electrostatic potential barrier) between P3 110 and FD 104, which may impede the transfer of charge from P3 110 to FD 104.

In some embodiments, P1 106, P2 108, and P3 110 may each be controlled by control signals (e.g., control voltages) applied to their respective control gates. Further, each control gate may include a vertical gate area (hereinafter "G") and an associated gate contact (hereinafter "GC"). For example, the control gate of P1 106 may include the $1^{st}$ vertical gate area 112 (hereinafter "G1"), which may further be electrically connected with the $1^{st}$ gate contact 122 (hereinafter "GC1") placed within gate control area 120. Similarly, the control gate of P2 108 may include the $2^{nd}$ vertical gate area 114 (hereinafter "G2") and the $2^{nd}$ gate contact (hereinafter "GC2") 124 placed within gate control area 120; the control gate of P3 110 may include the $3^{rd}$ vertical gate area 116 (hereinafter "G3") and the $3^{rd}$ gate contact 126 (hereinafter "G3") placed within gate control area 120. In some embodiments, G1 112, G2 114, and G3 116 may be formed using polysilicon materials and buried within substrate 130. In some embodiments, GC1 122, GC2 124, and GC3 126 may be formed using metal or polysilicon materials and may serve as respective "electrodes" to receive control signals (e.g., control voltages) applied to G1 112, G2 114, and G3 116. As shown in FIG. 1, in some embodiments, pixel 100 may include region 132 that is isolated from substrate 130 by dielectric material 150, at the outer layer surrounding the perimeter of pixel 100. In some embodiments, region 132 may be formed using polysilicon or metal materials. In some embodiments, region 132 may attract holes from PD 102, thus facilitating the accumulation of charge in PD 102 when PD 102 is exposed to light.

As shown in FIG. 1, in this example, G1 112, G2 114, and G3 116 may be disposed vertically one on top of another (thus only G3 116 is visible in the top view), laterally proximate their corresponding modulation regions P1 106, P2 108, and P3 110. In addition, G1 112, G2 114, and G3 116 may not necessarily overlap FD 104 vertically, as shown in FIG. 1. In this example, G1 112, G2 114, and G3 116 may stack vertically one on top of another. In addition, G1 112, G2 114, and G3 116 may each have a ring-shape geometry, thus completely enclosing their corresponding modulation regions P1 106, P2 108, and P3 110, as well as FD 102 (only laterally, as they do not overlap FD 102 vertically as described above). As a result, the potentials of P1 106, P2 108, and P3 110 may be modulated or controlled separately by respective control signals applied to G1 112, G2 114, and G3 116. For example, in some embodiments, the potential of P1 106 may be modulated by a control voltage signal applied to G1 112. For example, in some embodiments, P1 106 may be implanted with one or more p-type dopants. When a positive voltage is applied to G1 112, the positive voltage may repel holes in the layer of P1 106 interfacing G1 112 away from G1 112 to thus create a channel in the interfacing layer. As a result, charge may transfer from PD 102 through the channel of P1 106. Similarly, in some embodiments, the potential of P2 108 may be modulated by a control voltage signal applied to G2 114, and a channel may be formed within P2 102 for the charge to further transfer through P2 108. Similarly, in some embodiments, the potential of P3 110 may be modulated by a voltage control signal applied to G3, and a channel may be formed within P3 110 for the charge to further transfer through P3 110. As described in more detail below, in some embodiments, P2 108 may serve as an in-pixel charge memory region to temporarily store charge generated from PD 102. For example, at end of exposure, charge may be first transferred from PD 102 to P2 108 via P1 106. The charge may be temporarily stored in P2 108 until readout of pixel 100. At the readout, the charge may then be transferred from P2 108 to FD 104 via P3 110. Also, as shown in FIG. 1, in this example, pixel 100 may be configured to receive backside illumination. But alternatively, in some embodiments, front side illumination may be implemented.

In some embodiments, FD 104 may include capacitance. Thus, the transfer of charge into FD 104 may generate an analog voltage between FD 104 and the ground. The analog voltage may represent the image signals captured by pixel 100. The analog voltage of FD 104 may further be accessed and read out of FD 104, e.g., using a pixel readout circuit formed by one or more transistors, to generate an analog voltage at a pixel output line outside pixel 100. In some embodiments, the image sensor may include multiple pixel output lines for reading out the FD voltages from pixels of different columns (e.g., one pixel output line for one corresponding column in the row-by-row readout). In some embodiments, the image sensor may also include one or more analog-to-digital circuits to convert the analog voltages of the pixel output lines to digital signals. In some embodiments, the image sensor may further include a transfer circuit that transmits the digital signals to an external component, e.g., an image signal processor (ISP), for further digital processing to generate the images.

Figure 2:
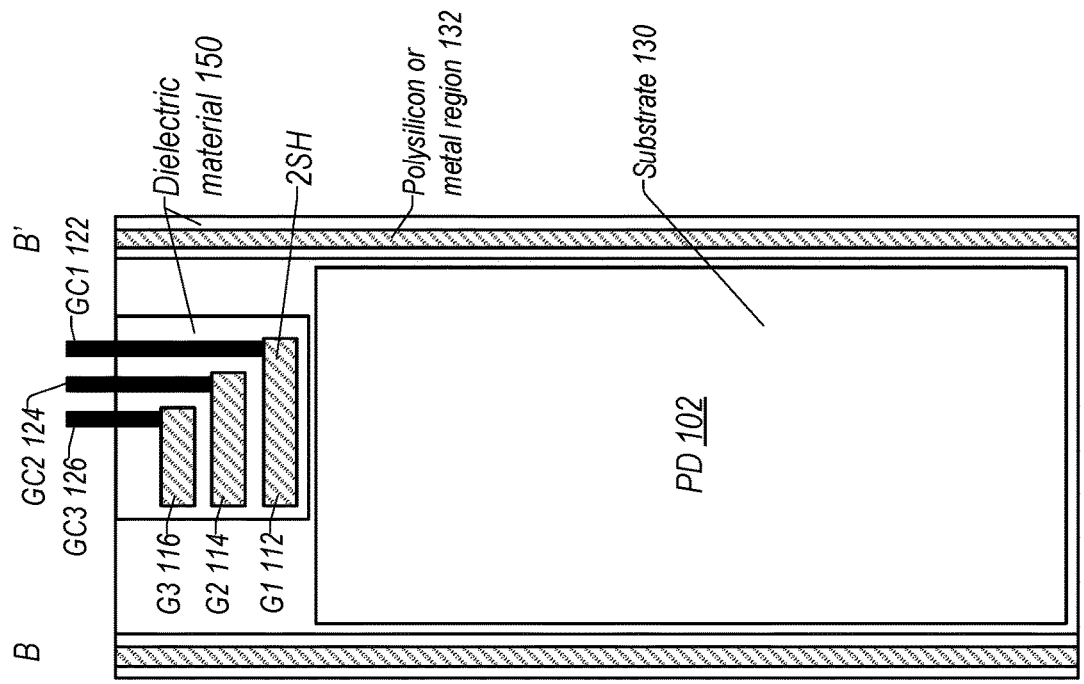
FIG. 2 shows example implementations for control gates of a pixel of an image sensor, according to some embodiments.
Figure 2:
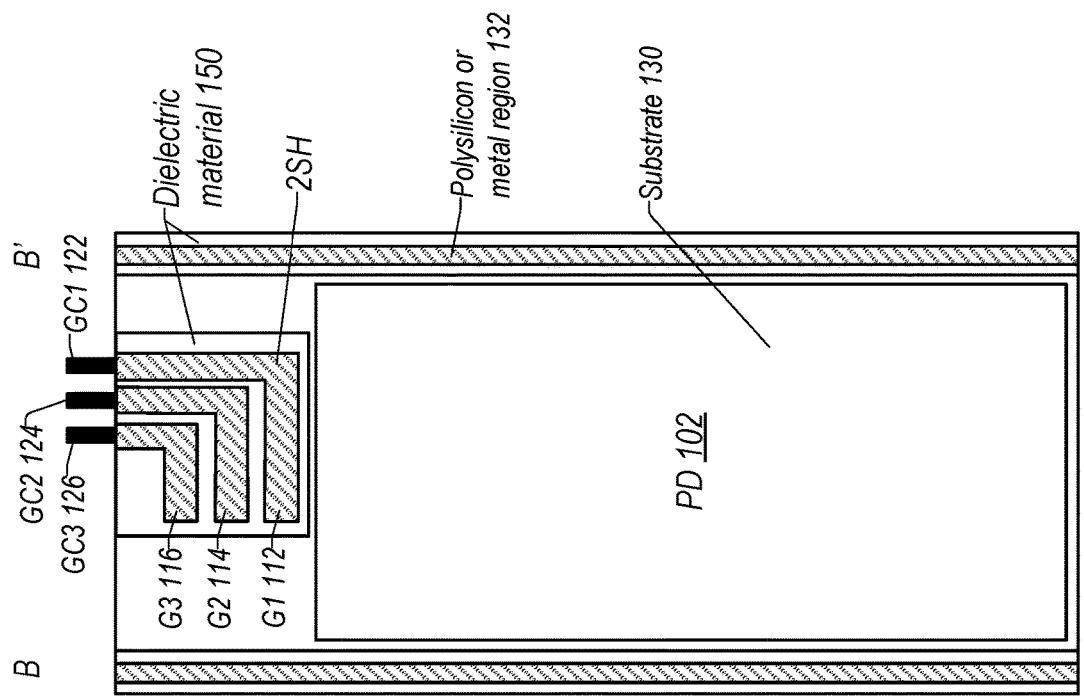

FIG. 2 shows example implementations for control gates of a pixel of an image sensor, according to some embodiments. As shown on the left of the figure, in some embodiments, vertical gate areas G1 112, G2 114, and G3 116 may individually include extensions to the surface of substrate 130. For example, G1 112, G2 114, and G3 116 may each have an L-shape geometry, buried inside substrate 130, which extends to the surface of substrate 130. Further, GC1 122, GC2 124, and GC3 126 may be attached to G1 112, G2 114, and G3 116 at the surface of substrate 130. Alternatively, as shown on the right of FIG. 2, in some embodiments, G1 112, G2 114, and G3 116 may each have a horizontal I-shape geometry, buried inside substrate 130, whereas GC1 122, GC2 124, and GC3 126 may extend inside substrate 130 to be electrically connected with G1 112, G2 114, and G3 116.

Figure 3:
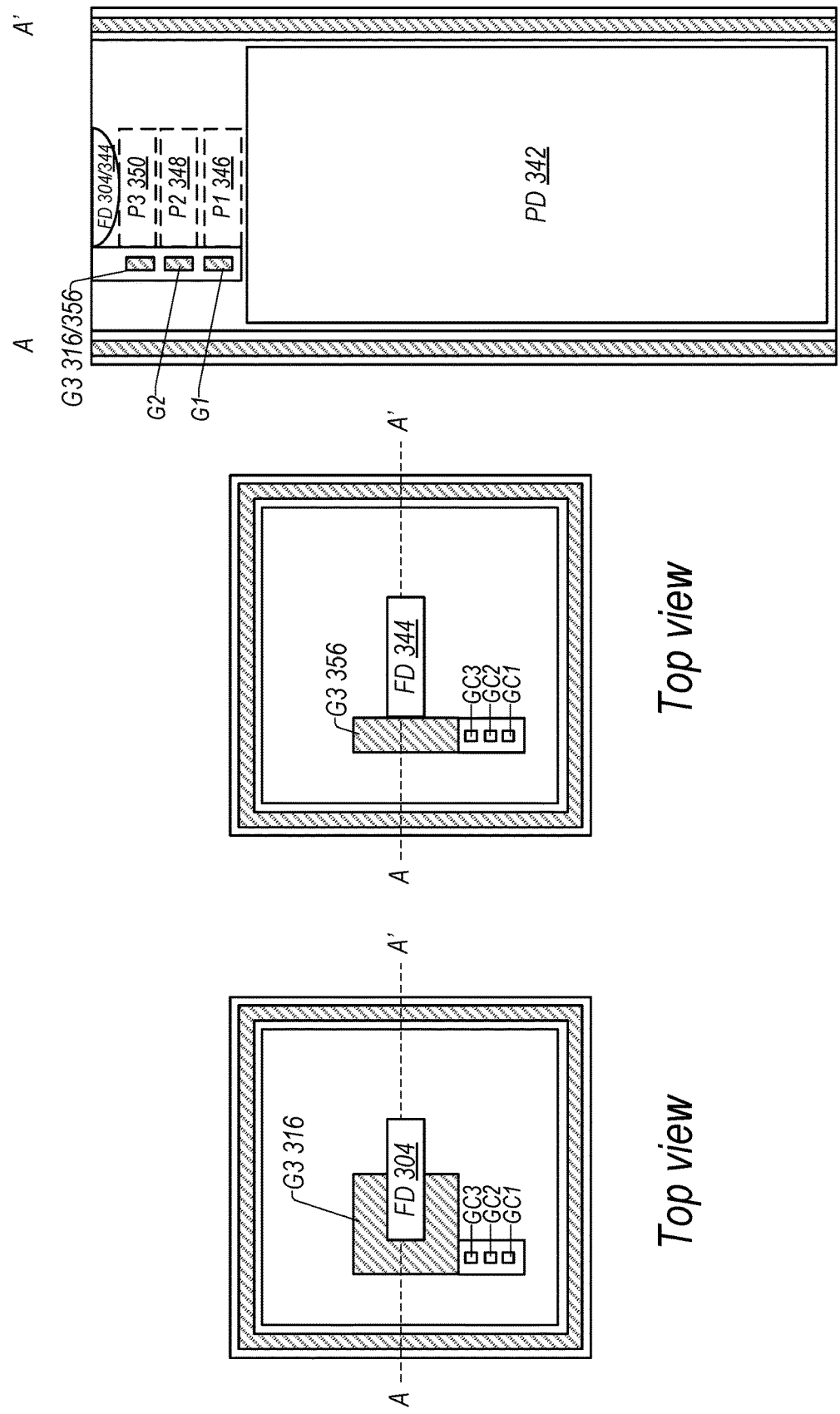
FIG. 3 shows example implementations for vertical gate areas of a pixel of an image sensor, according to some embodiments.

FIG. 3 shows example implementations for vertical gate areas of a pixel of an image sensor, according to some embodiments. Unlike the vertical gate areas of FIG. 1, as shown on the left of FIG. 3, in some embodiments, the vertical gate areas G1, G2, and G3 of a pixel (e.g., the $3^{rd}$ vertical gate area G3 316 visible in the top view) may individually have a C-shape geometry, thus only partially (not completely) enclosing FD 304 (laterally) and the corresponding charge modulation regions. Similarly, each vertical gate area G1, G2, and G3 may be electrically connected with an associated gate contact (e.g., GC1, GC2, and GC3) for receiving a respective control signal. Alternatively, as shown in the middle of FIG. 3, in some embodiments, the vertical gate areas of a pixel (e.g., the 3rd vertical gate area G3 356 visible in the top view) may individually have an I-shape geometry, disposed proximate FD 344 and the corresponding charge modulation regions. The cross-section view on the right of FIG. 3 represents a cross-section view for both the above described C-shape and I-shape pixels. As shown in the cross-section view, PD 342 and FD 304 (for the C-shape pixel) or 344 (for the I-shape pixel) may be still disposed vertically one relative to another. Similarly, the charge transfer region vertically between the PD and FD may include multiple charge modulation regions, e.g., P1 346, P2 348, and P3 350 stacked vertically one on top of another. However, unlike FIG. 1, the P1, P2, P3, and FD may have smaller cross-section areas, thus only partially rather than completely overlapping PD 342. In some embodiments, different doping concentrations in P1, P2, and P3 of the C-shape and I-shape pixels may be introduced by implants or other methods to create sufficient capacitance and facilitate the vertical charge transfer. Note that FIGS. 1-3 are provided only as non-limiting examples for purposes of illustration. In some embodiments, the various regions of a pixel may be formed and arranged in a variety of ways. For example, in some embodiments, the different embodiments of FIGS. 1-3 may be used in combination for a given pixel, such that some of the vertical gate areas of a pixel may be formed in a ring-shape, whereas the others in an C-shape.

Figure 4A:
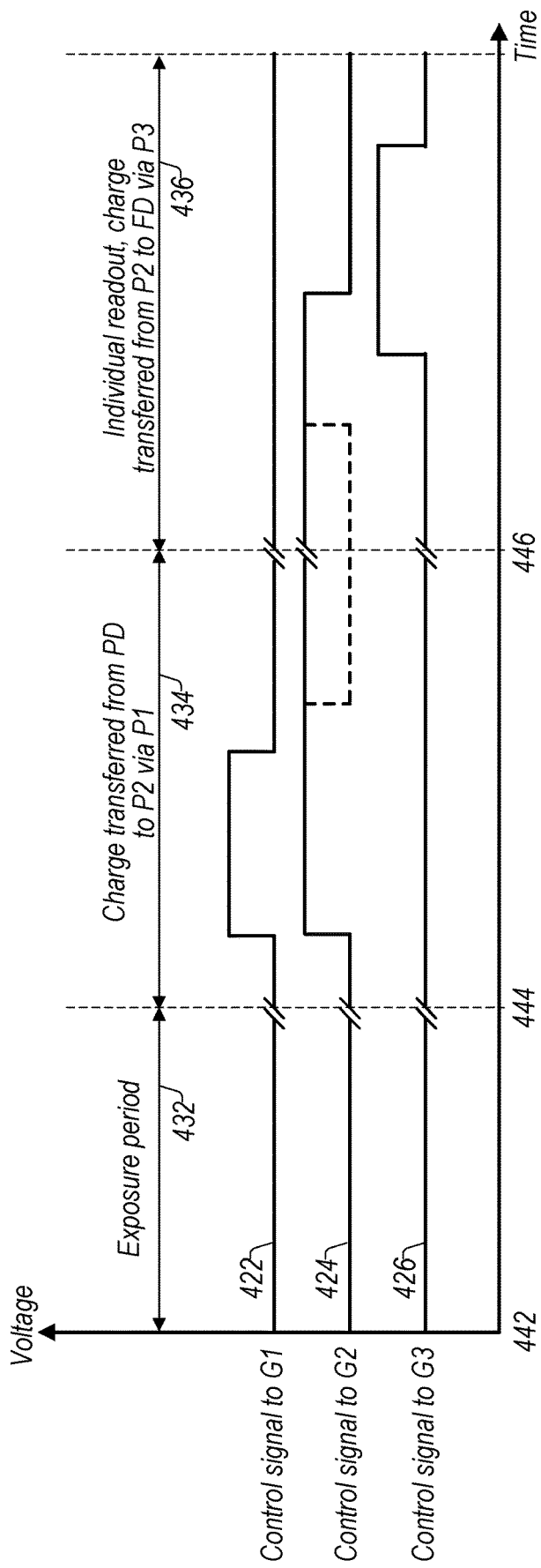
FIGS. 4A-4D show example timing diagrams of control signals and potential profile of a pixel of an image sensor to illustrate charge transfer, according to some embodiments.
Figure 4B:
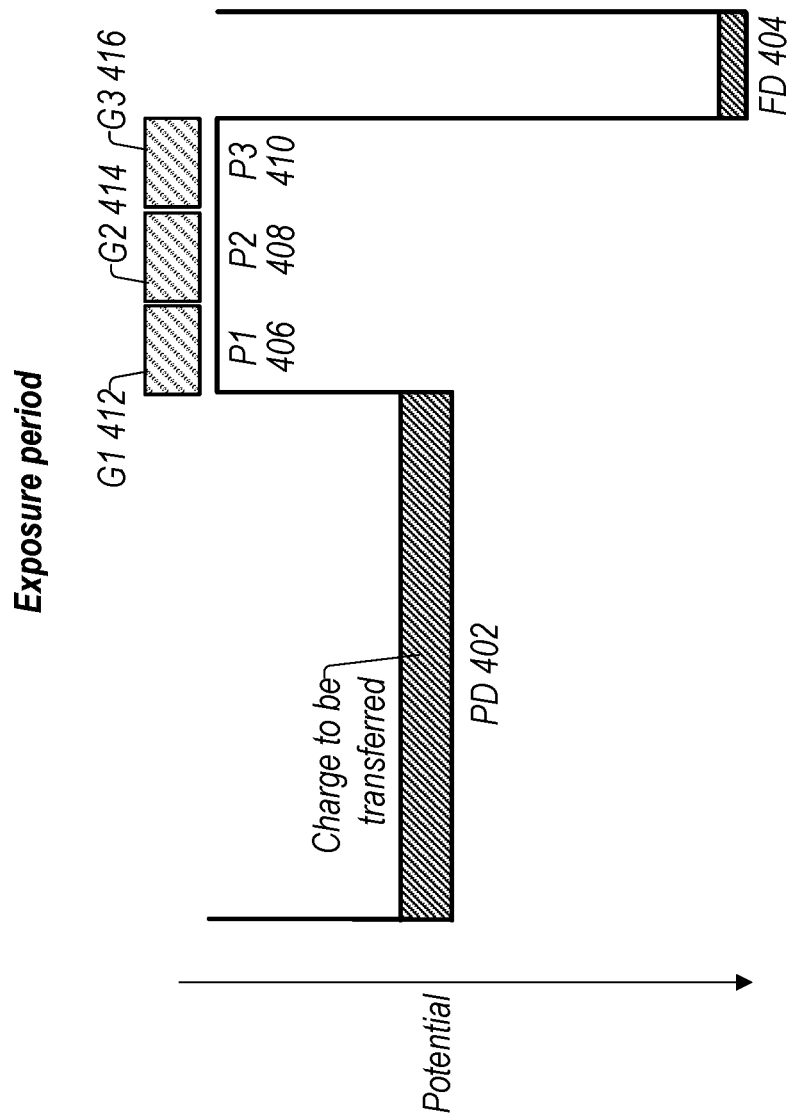

FIGS. 4A-4D show example timing diagrams of control signals and potential profile of a pixel of an image sensor to illustrate charge transfer, according to some embodiments. In FIG. 4A, the horizontal axis denotes time, whereas the vertical axis denotes voltage control signals 422, 424, and 426 applied to gate areas G1 412, G2 414, and G3 416 of a pixel. As shown in FIG. 4A, operation of the pixel may include three periods 432, 434, and 436. During the $1^{st}$ period 432, all the pixels (including the one shown in FIGS. 4A-4D) of an image sensor may get exposed. For example, all the pixels may begin to be exposed to the light simultaneously at time 442, and end the exposure simultaneously at time 444. With the exposure, during period 432, all the pixels may generate and accumulate charge within their respective PD regions. FIG. 4B represents a potential file for the different regions of a pixel of the image sensor corresponding to period 432. As shown in FIG. 4B, during period 432, no active control voltages 422, 424, and 426 are applied to G1 412, G2 414, and G3 416 (or applied by a negative voltage if needed). For example, G1 412, G2 414, and G3 416 may be biased at zero voltage (or a negative voltage if needed). Thus, it shows that the charge may be accumulated inside PD 402, and P1 406, P2 408, and P3 410 may be turned off. In some embodiments, the different regions of the pixel may have different doping types and/or doping concentrations. For example, in some embodiments, PD 402 may be a n-type region formed with one or more n-type dopants, P1 406, P2 408, and P3 410 may be p-type regions formed with one or more p-type dopants, P1, P2, P3 might also be n-type regions with different doping concentrations. and FD 404 may be a n-type region formed with one or more n-type dopants. Thus, as shown in FIG. 4B, the potential profile of PD 402, P1 406, P2 408, P3 410, and FD 404 may have a multi-stepped shape. In addition, in this example, P1 406, P2 408, and P3 410 may also have the same doping concentration. Thus, in FIG. 4B, at turn-off, P1 406, P2 408, and P3 410 may have the same potential. Alternatively, in some embodiments, P1 406, P2 408, and P3 410 may have different doping concentration, which may cause different potentials (e.g., in a multi-stepped shape) between these regions.

Figure 4C:
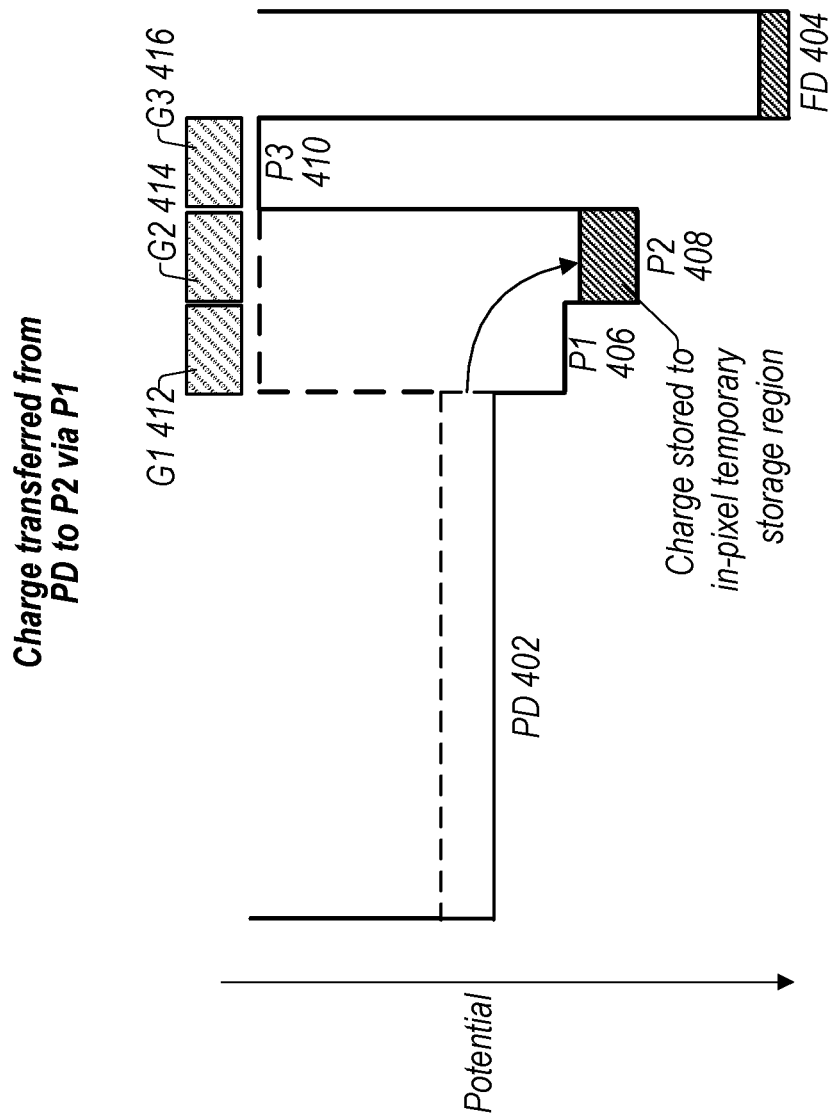

During the $2^{nd}$ period 434, after the exposure ends for all the pixels of the image sensor, all the pixels may transfer the charge from their PD regions to their in-pixel memory regions, e.g., their P2 regions, simultaneously at the same time. For example, as shown in FIG. 4A, active control voltages 422 and 424 may be applied to G1 412 and G2 414, whereas no active control voltage 426 may be applied to G3 410. In other words, P1 406 and P2 408 may be turned on, whereas P3 410 may stay off. For example, as shown in FIG. 4A, positive voltages may be applied to G1 412 and G2 414, whereas G3 416 may be stilled biased at the zero voltage (or negative voltage if needed). As described above, in some embodiments, the positive voltages may repel holes within the interfacing layers of P1 406 and P2 408 aways from P1 406 and P2 408, thus allowing at least some of the charge to be transferred from PD 402 into P1 406 and P2 408. In addition, as described above, at turn-off, P1 406 and P2 408 may have the same potential. Thus, in some embodiments, voltages of different values may be applied to G1 412 and G2 414, thus causing the stepped-potential profile between P1 406 and P2 408, as shown in FIG. 4C corresponding to period 434. As a result, the charge may be transferred from PD 402 to P2 408 via P1 406, as shown in FIG. 4C. As described above, in some embodiments, P1 406 and P2 408 may have different doping concentrations and thus different potentials at turn-off. Thus, in that case, voltages of the same value may be applied to G1 412 and G2 414 to still maintain the stepped-potential profile between P1 406 and P2 408 shown in FIG. 4C for the charge to be transferred from PD 402 to P2 408 via P1 406.

Figure 4D:
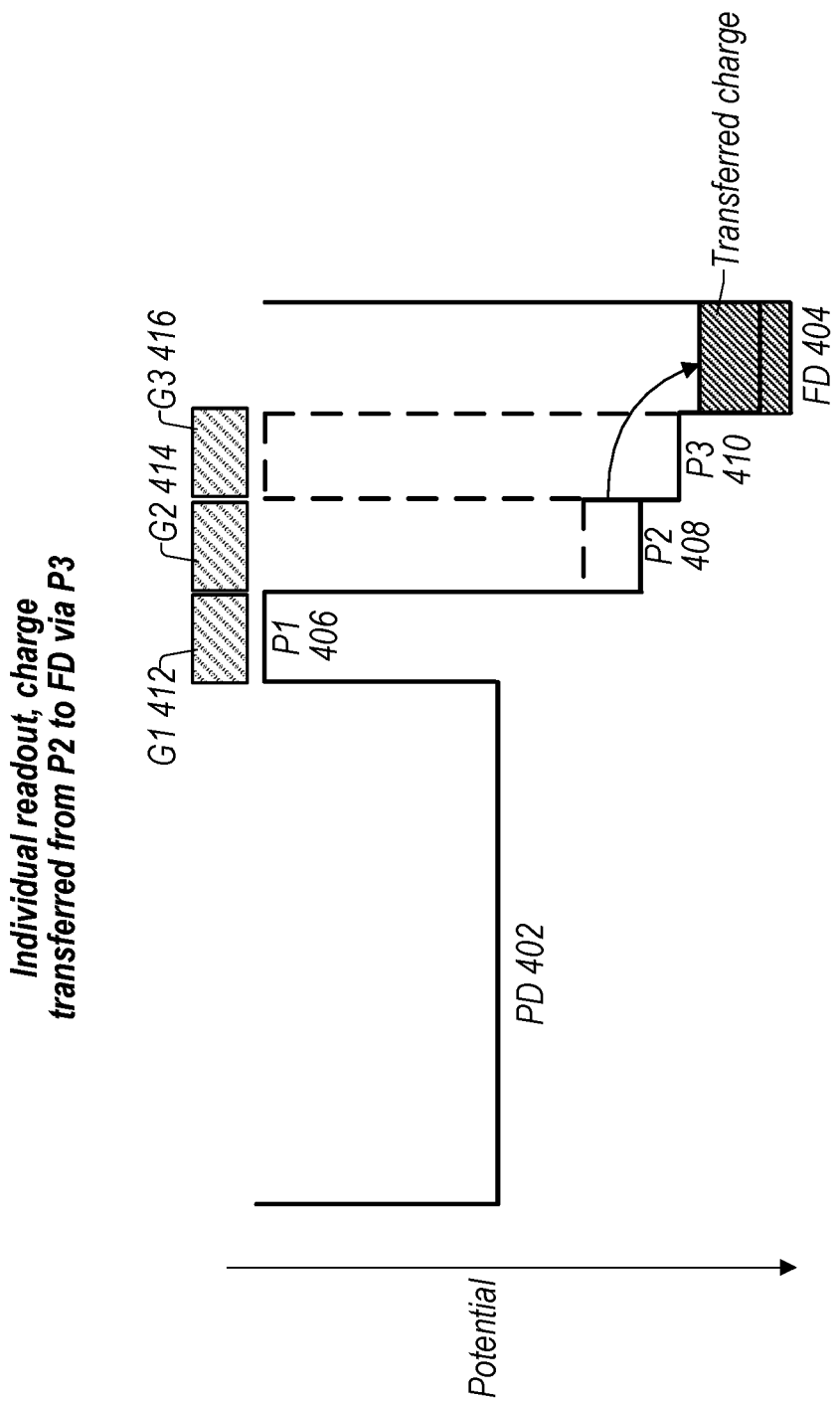

As described, once the charge is transferred to P2 408, P2 408 may function as an in-pixel charge memory region to temporarily store the charge there until readout of the pixel. Again, as described above, the pixels of the image sensor may be read out individually at respective times. For example, in a row-by-row readout mode, pixels of the same row may be read out at the same time, whereas pixels in the same column but different rows may be read out sequentially one by one. As shown in FIG. 4A, at time 446 the pixel may be selected to be read out. During the $3^{rd}$ period 436, active control voltages 424 and 426 may be applied to G2 414 and G3 416, whereas no active control voltage 422 may be applied to G1 412. In other words, P2 408 and P3 410 may be turned on, whereas P1 406 may be turned off. For example, as shown in FIG. 4A, positive voltages may be applied to G2 414 and G3 416, whereas G1 412 may be biased at the zero voltage (or negative voltage if needed). Similar to what is described above, voltages of different values may be applied to G2 414 and G3 416, thus creating the stepped-potential profile between P2 408 and P3 410 to transfer the charge from P2 408 to FD 404 via P3 410, as shown in FIG. 4D corresponding to period 436. Alternatively, P2 408 and P3 410 may have different doping concentrations, and voltages of the same value may be applied to G2 414 and G3 416, to still maintain the stepped-potential profile between P2 408 and P3 410 to transfer the charge from P2 408 to FD 404 via P3 410. As shown in FIG. 4A, in some embodiments, active control voltage 424 may be continuously applied to G2 414 during periods 434 and 436. Alternatively, in some embodiments, active control voltage 424 may be removed at the end of period 436 when the charge has been transferred from PD 402 to P2 408, and then re-applied at or near the beginning of period 436 to transfer the charge from P2 408 to FD 404, as shown by the dashed line of FIG. 4A. In combination of FIGS. 4A-4D, using appropriate control signals, an image sensor may be controlled to operate in the global shutter mode. All pixels of the image sensor may get exposed and transfer accumulated charge from their PD regions to in-pixel memory regions, e.g., their P2 regions, simultaneously during the same time interval. Then the pixels may be individually read out, e.g., during their respective rolling readout intervals, in which the charge may be transferred from the individual pixels' P2 regions to their FD regions.

Figure 5A:
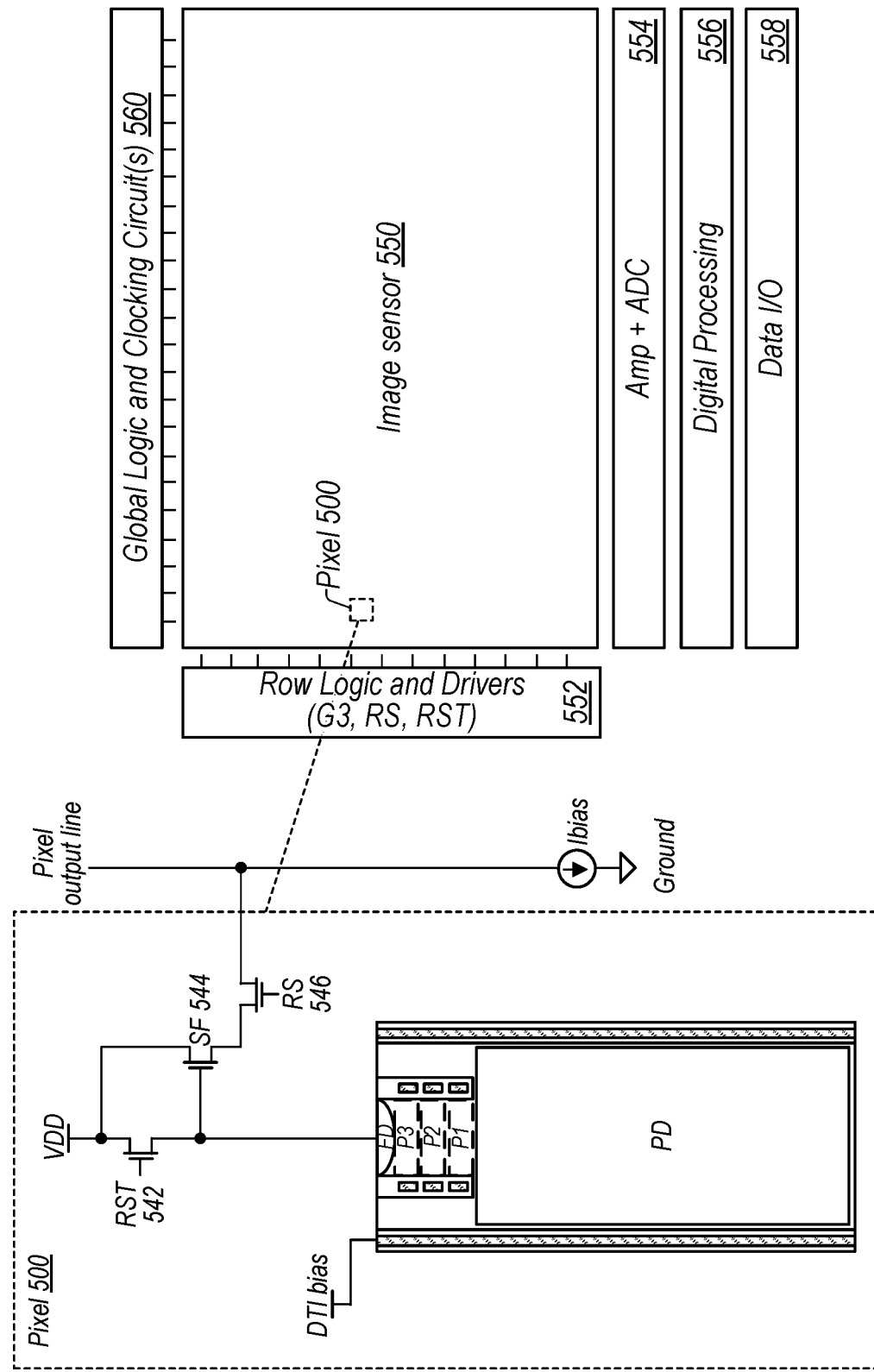
FIG. 5A shows a cross-section view of an example pixel and a top view of an image sensor, according to some embodiments.

FIG. 5A shows a cross-section view of an example pixel and a block diagram of an image sensor, including the readout and image signal processing circuits, according to some embodiments. As shown in FIG. 5A, pixel 500 may be one of a plurality of pixels of image sensor 550. Also, as described above, in some embodiments, the plurality of pixels may be organized as a pixel array having one or more rows and one or more columns of pixels. Similar to the pixels described above, pixel 500 may include at least one PD, a FD, and a vertical charge transfer region between the PD and FD, which includes P1, P2, and P3. In addition, for purposes of illustration, FIG. 5A shows at least some of the transistors that may be used to form a pixel readout circuit for reading out the image signals of pixel 500. For example, in some embodiments, the pixel readout circuit may include reset transistor ("RG") 542, source-follower transistors ("SF") 544, and read selection transistor ("RS") 546. As shown in FIG. 5A, the FD may be coupled to a reset voltage VDD via RG 542. In some embodiments, RG 542 may be selectively turned on to reset the voltage of the FD to VDD. Further, as shown in FIG. 5A, the FD may be also coupled with SF 544 and one or more RS 546. In some embodiments, SF 544 and RS 546 may be turned on to couple the FD to the pixel output line, through which the voltage of the FD may be accessed and read out. In some embodiments, SF 544 may provide a voltage buffer for the voltage of the FD, whereas RS 546 may be selectively turned on to couple the FD with the pixel output line for reading out the voltage of the FD. During readout, SF 544 and RS 546 may be first turned on to couple the FD to the pixel output line. Next, RG 542 may be turned on to reset the voltage of the FD to the reset voltage VDD. The voltage of the FD may be sampled, e.g., using amplifier and analog-to-digital circuits 554, as the $1^{st}$ sample of the voltage of the FD. Next, RG 542 may be turned off, and the charge transfer region between the PD and FD may be turned on to transfer charge from the PD to the FD, as described above in FIGS. 1-4. As described above, transfer of the charge may generate an analog voltage across the capacitance C of the FD. The voltage of the FD may again be accessed and read out at the pixel output line through SF 544 and RS 546, as described above. The voltage of the FD may be sampled, e.g., using amplifier and analog-to-digital circuits 554, as the $2^{nd}$ sample of the voltage of the FD. The difference between the first sample and second sample may be calculated to cancel out the reset voltage VDD, and the differential voltage may be determined as the final image signal from pixel 500. The image signal may be further processed, e.g., using digital processing circuit(s) 556. The image signal may be transmitted, e.g., using data transfer I/O circuit(s) 558, to an image signal processor (ISP) to be processed to produce an image. In addition, as shown in FIG. 5A, image sensor 550 may also include row logic and drivers circuit(s) 552 and global logic and clocking circuit(s) 560 in order to generate the appropriate control signals for the plurality of pixels of image sensor 550.

Figure 5B:
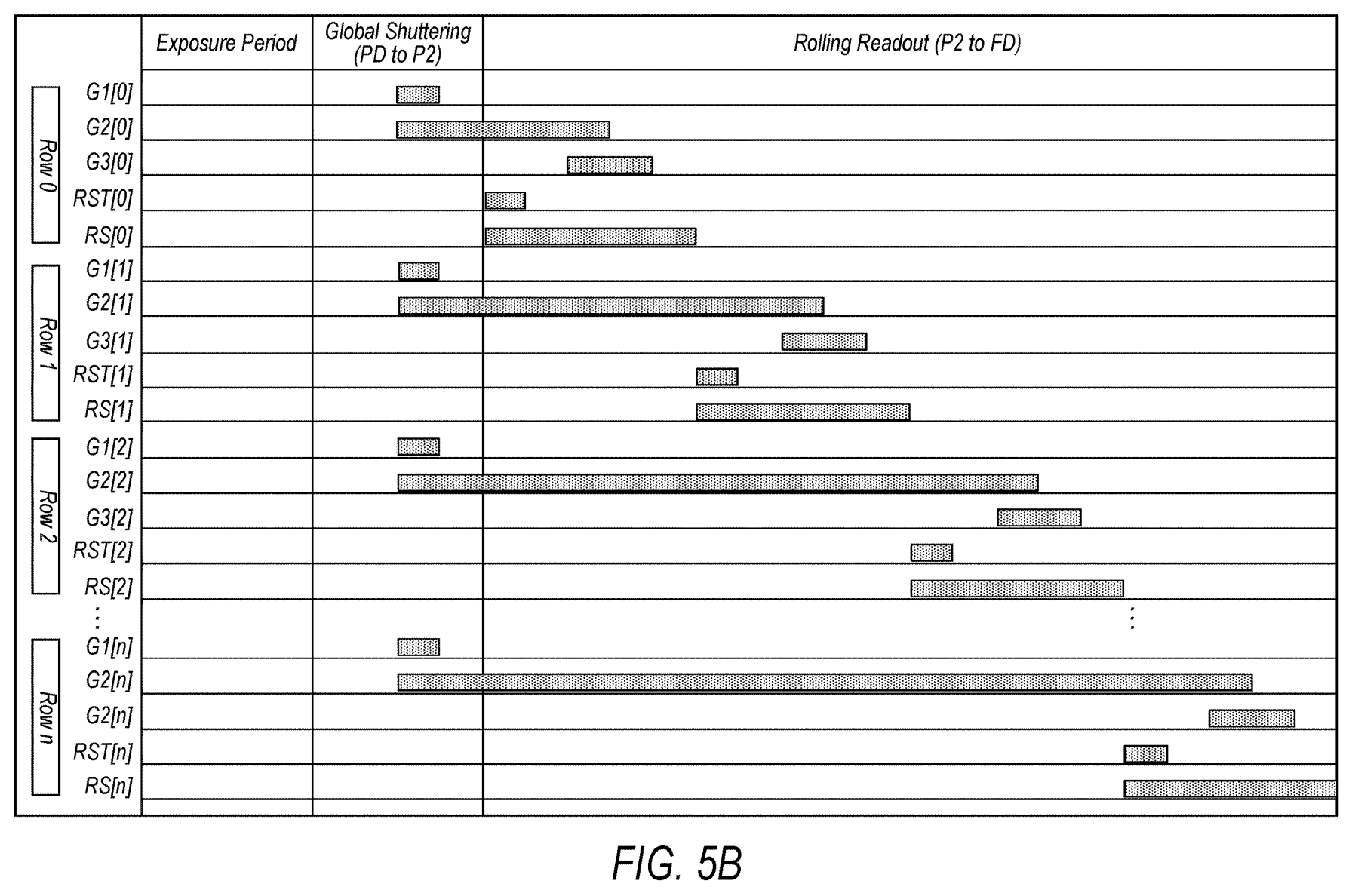

FIG. 5B shows example control signals applied to different components of a plurality of pixels of image sensor 550, according to some embodiments. FIG. 5B shows information similar to what is described above with respect to FIGS. 4A-4D, but for a plurality of pixels instead of one individual pixel. For example, as shown in FIG. 5B, the control signals shown here include control signals applied to the pixels of different rows, e.g., row 0, row 1, row 2, . . . , row n. In this example, image sensor 550 may operate in a global shutter mode. For example, all the pixels may be exposed during a $1^{st}$ period, e.g., an exposure period (similar to period 432 of FIGS. 4A-4D). In addition, all the pixels may transfer the charge for their PD regions to their in-pixel memory regions, e.g., their P2 regions, simultaneously during a $2^{nd}$ period, e.g., a global shutting period (similar to period 434). Further, the pixels of the image sensor may be read out individually at respective times during a 3rd period, e.g., rolling readout period (similar to period 436). Similar to what is described above in FIGS. 4A-4B, as shown in FIG. 5B, during the $1^{st}$ period, no active control voltages may be applied to the control gates of the pixels of image sensor 550, and thus all the gates may be turned off, so that the pixels may accumulate charge in their respective PD regions. In addition, similar to what is described above in FIGS. 4A and 4C, as shown in FIG. 5B, during the $2^{nd}$ period, active control voltages may be applied to the control gates G1 and G2 of the pixels of image sensor 550, and thus all the pixels may transfer the charge from their respective PD regions to P2 regions via P1 regions simultaneously. Moreover, similar to what is described above in FIGS. 4A and 4D, as shown in FIG. 5B, during the $3^{rd}$ period, active control voltages may be applied to the control gates G2 and G3 of the pixels of image sensor 550 at respective readout times, and thus the respective pixels may transfer the charge from their respective P2 regions to FD regions via the P2 regions. Also, as described above in FIG. 5A, different control signals may be applied to the transistors (e.g., the RST and RS transistors) of the respective pixels to select and read out the respective pixels, as shown in FIG. 5B. Also, as shown in FIG. 5B, these transistor control signals may be applied at different times for pixels of different rows to represent the rolling readout operation. For example, the control signals to RSG[0] and RS[0] of a pixel of row 0 may be applied ahead of the control signal to RSG[1] and RS[1] of a pixel of row 1, meaning that the pixel of row 0 may be read before the pixel of row 1. As described above, the charge may be transferred from PD regions to P2 regions for all the pixels globally at the same time during the 2$^{nd}$ period. However, the pixels of the different rows may be read out at different times. Thus, the P2 regions may thus serve as in-pixel charge memory regions to temporarily store the charge for each individual pixel.

Figure 6:
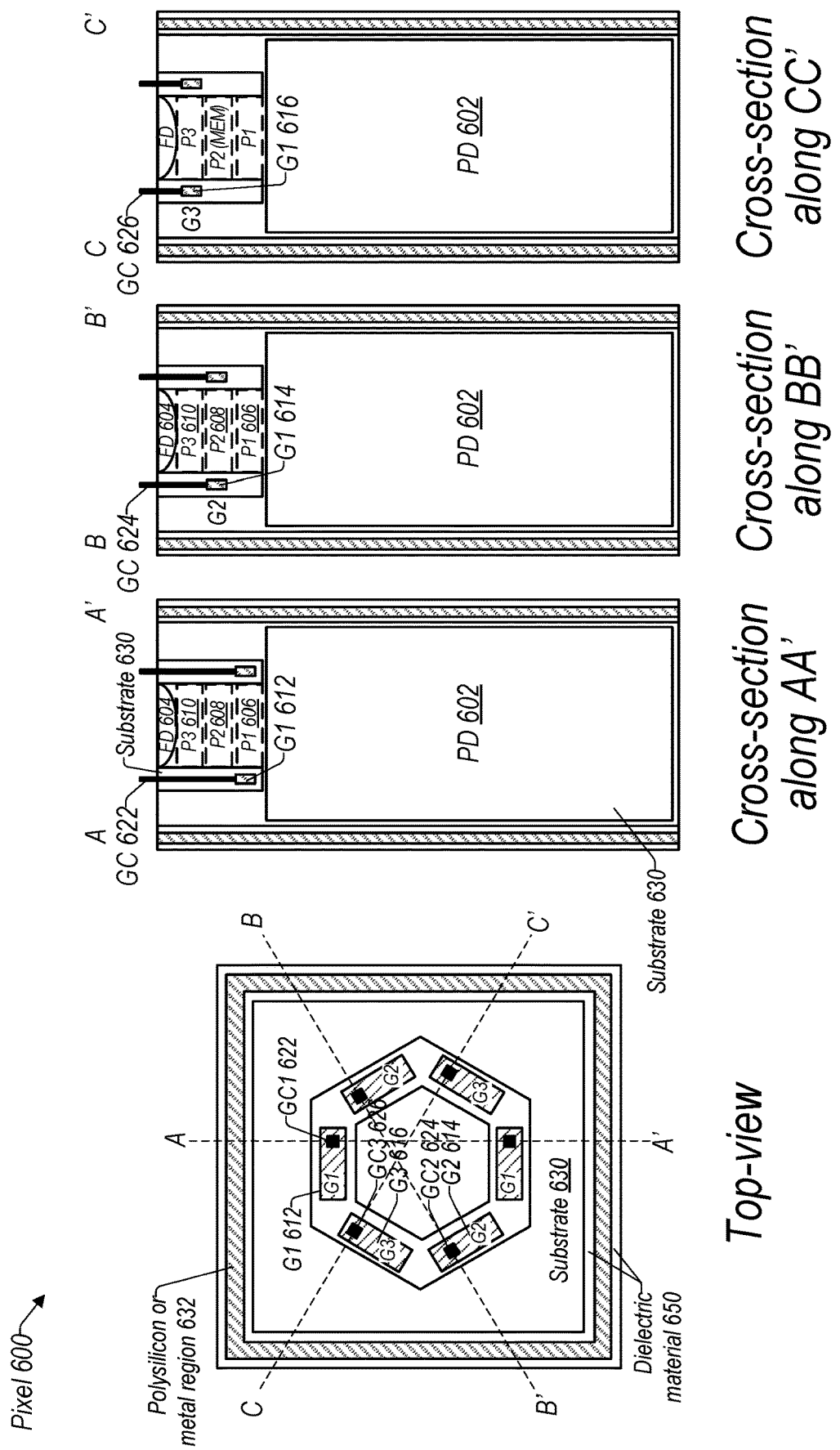
FIG. 6 shows top view and cross-section view of another example pixel of an image sensor, according to some embodiments.

FIG. 6 show top view and cross-section view of another example pixel of an image sensor, according to some embodiments. As shown in FIG. 6, in some embodiments, the gate areas G1 612, G2, 614, and G3 616 of pixel 600 may be placed in a hexogen-shape arrangement. In addition, G1 612, G2, 614, and G3 616 may be each electrically connected with a gate contact, e.g., GC1 622, GC2 624, and GFC3 626. Also, unlike the pixels described above, in FIG. 6, GC1 622, GC2 624, and GFC3 626 may not necessarily overlap each other. Instead, they may be placed around the perimeter of the hexogen shape, where the gate area for each charge modulation region may include a first portion of the gate area connected with a first portion of a gate contact and a second portion of the gate area connected with a second portion of the gate contact, each pair located at one of two opposite sides of the corresponding charge modulation region. For example, as shown in the cross-section view along AA', G1 612 of P1 606 may include a first G1 portion on the left and a second G1 portion on the right of P1 606. The left G1 portion may be electrically connected with a first GC portion 622, whereas the right G1 portion may be electrically connected with a second GC portion 622, and the first and second GC portions may be electrically connected with each other. In addition, as shown in FIG. 6, in some embodiments, G1 612, G2 614, and G3 616 may be buried inside substrate 630 at different depths. For example, G1 612 may be buried at the deepest depth closer to PD 602, G3 616 may be buried at the shallowest depth closer to the surface of substrate 630, whereas G2 614 may be buried in the middle.

Figure 7:
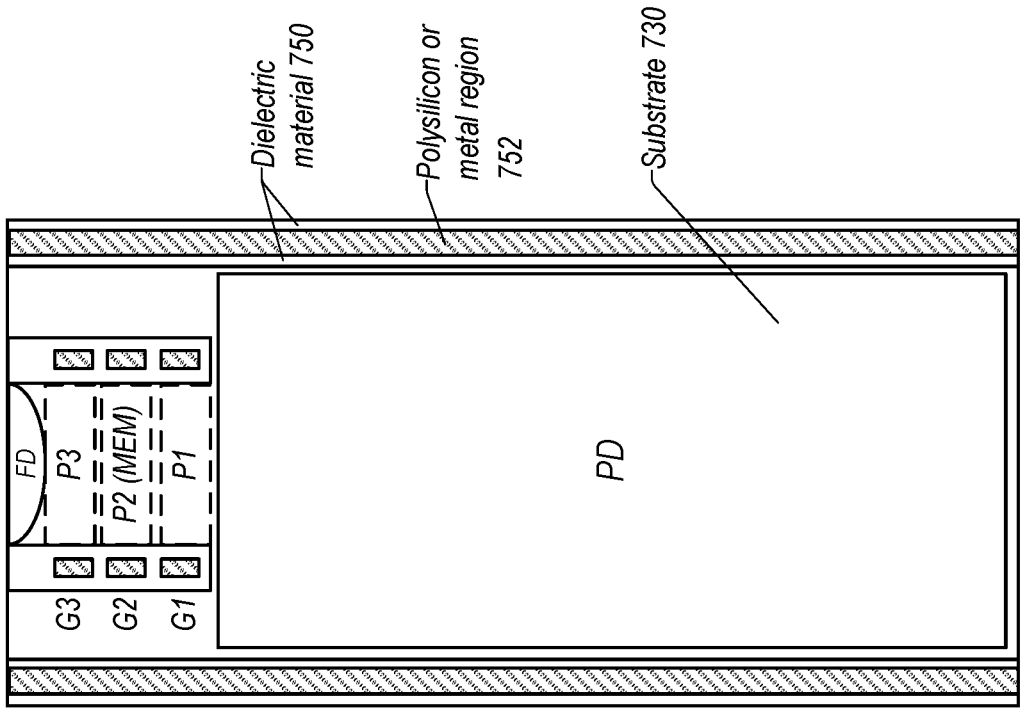
FIG. 7 shows example isolation structures of a pixel of an image sensor, according to some embodiments.
Figure 7:
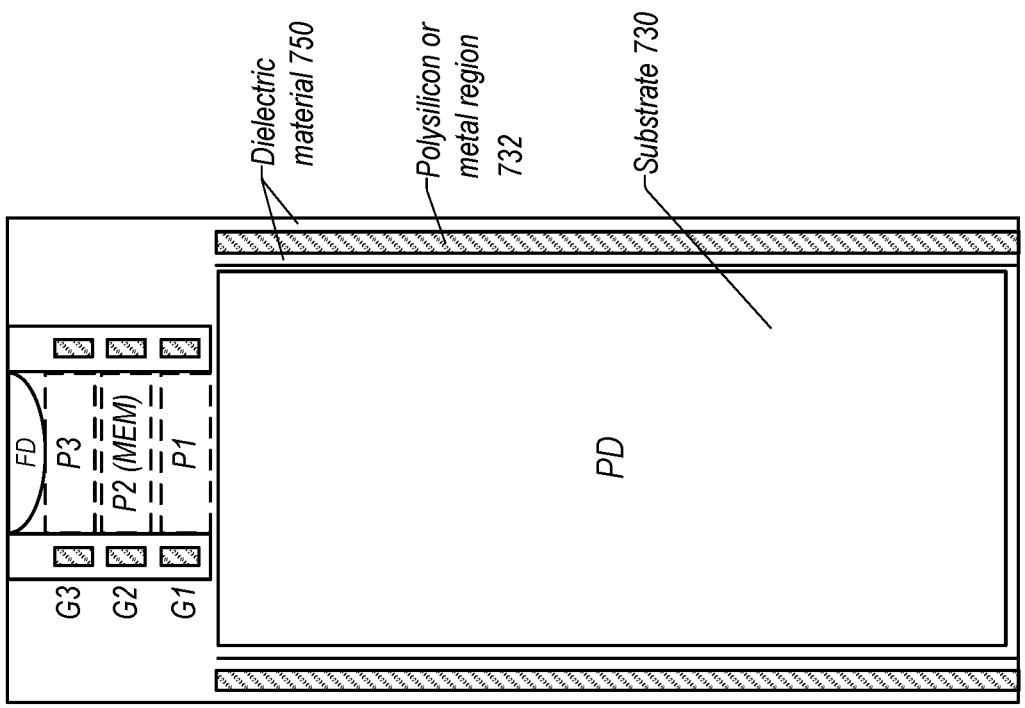

FIG. 7 shows example isolation structures of a pixel of an image sensor, according to some embodiments. The figure on the left shows a partial deep trench isolation (DTI) for a pixel, according to some embodiments. As shown in the figure, in some embodiments, the DTI may include region 732 formed using polysilicon or metal materials. In some embodiments, region 732 may be formed within a trench (filled with the polysilicon or metal materials) that is isolated from substrate 730 by dielectric material 750, and the trench may enclose the PD region of the pixel. In some embodiments, region 732 may be biased to create passivation for the trench surface to isolate the pixel from other pixels next to the pixel. Alternatively, in some embodiments, the trench may be filled with high-k dielectric material(s). In this case, region 732 may not necessarily need to be biased. The figure on the right shows an alternative isolation structure, a deep doping well isolation, for a pixel. As shown in this figure, the trench for region 752 may extend all the way to the surface of the pixel. The trench may be implanted with dopants to create electrical isolation between pixels.

Figure 8:
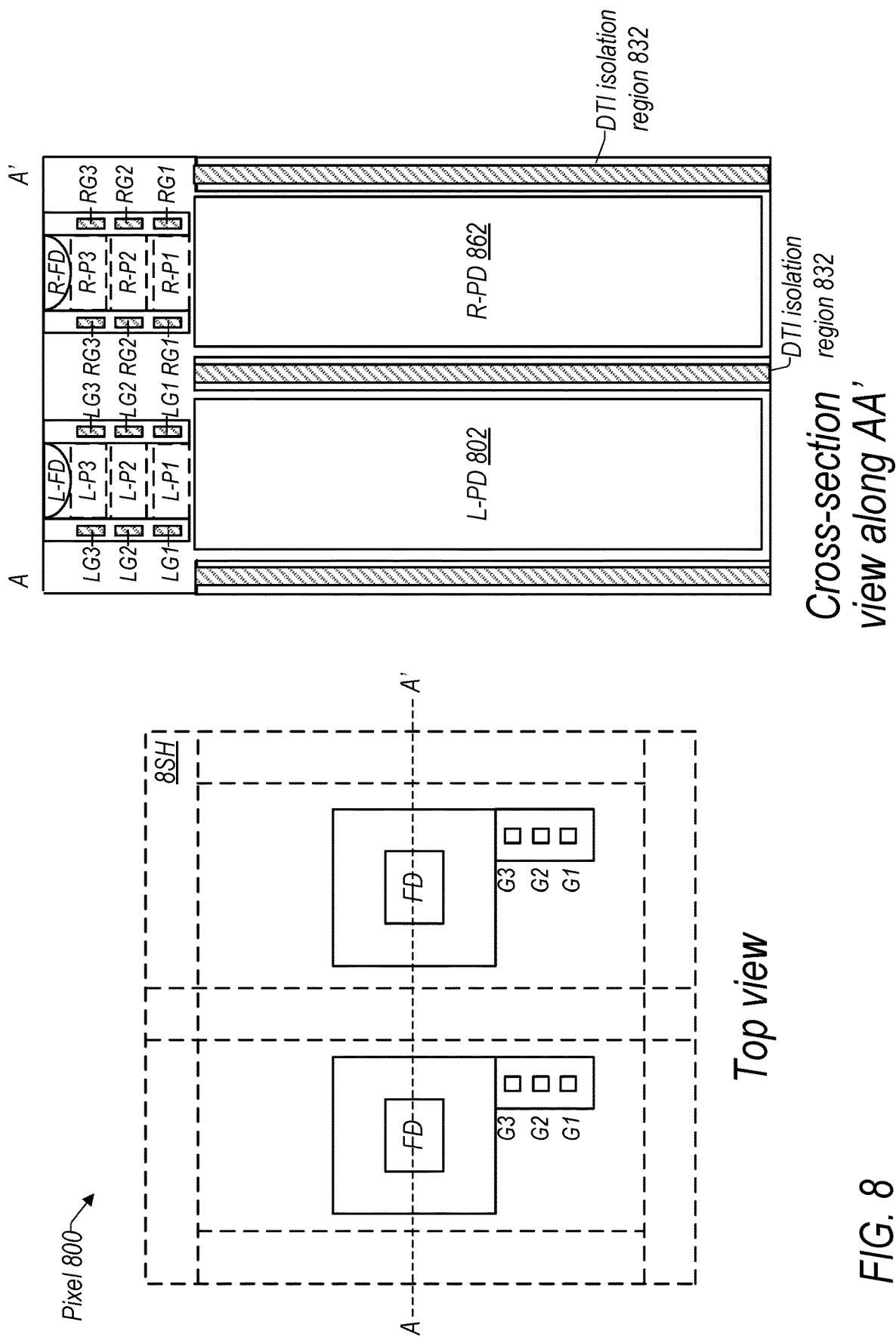
FIG. 8 shows an example split pixel for autofocus application, according to some embodiments.

FIG. 8 shows an example split pixel for autofocus application, according to some embodiments. As shown in FIG. 8, pixel 800 may include at least two PDs, left PD 802 and right PD 862. In some embodiments, PD 802 and PD 862 may be isolated from each other using one or more isolation structures. For example, as shown in FIG. 8, in some embodiments, the two PDs may be isolated by partial deep trench insolation (DTI) region 832, as described above, located between PD 802 and PD 862. In some embodiments, each PD may be associated with a FD and vertical charge transfer region including P1, P2, and P3. For example, left PD 802 may be associated with left P1 (L-P1), left P2 (L-P2), left P3 (L-P3), and left FD (L-FD), whereas right PD 862 may be associated with right P1 (R-P1), right P2 (R-P2), right P3 (R-P3), and right FD (R-FD), similar to what is described above in FIGS. 1-7. Further, L-FD and R-FD may be electrically connected together, such that the image signals of L-FD and R-FD may be read out to a pixel output line using the same pixel readout circuit. During operation, gate areas LG1 (for L-P1) and RG1 (for R-P1) may receive control signals at or around the same time, and LG2 (for L-P2) and RG2 (R-P2) may receive the control signals at or around the same time, such that the charge may be transferred from PD 802 to L-FD simultaneously as the charge transfer from PD 862 to R-FD. However, gate areas LG3 (for L-P3) and RG3 (for R-P3) may receive control signals at different times so that the charge may be transferred from L-P2 to L-FD and from R-P3 to R-FD at different times. In other words, the images signals for L-PD 802 and R-PD 862 of pixel 800 may be read out sequentially. In some embodiments, pixel 800 may be used for autofocus of an image capturing device. For example, when light comes at an angle to pixel 800, the amount of light captured by L-PD 802 and R-PD 862 may be different. Accordingly, the two PDs may accumulate different amounts of charge and thus cause different output voltages at readout. In some embodiments, the difference between the output voltages from L-PD 802 and R-PD 862 may be used to adjust and/or perform autofocus of the image capturing device.

Figure 9:
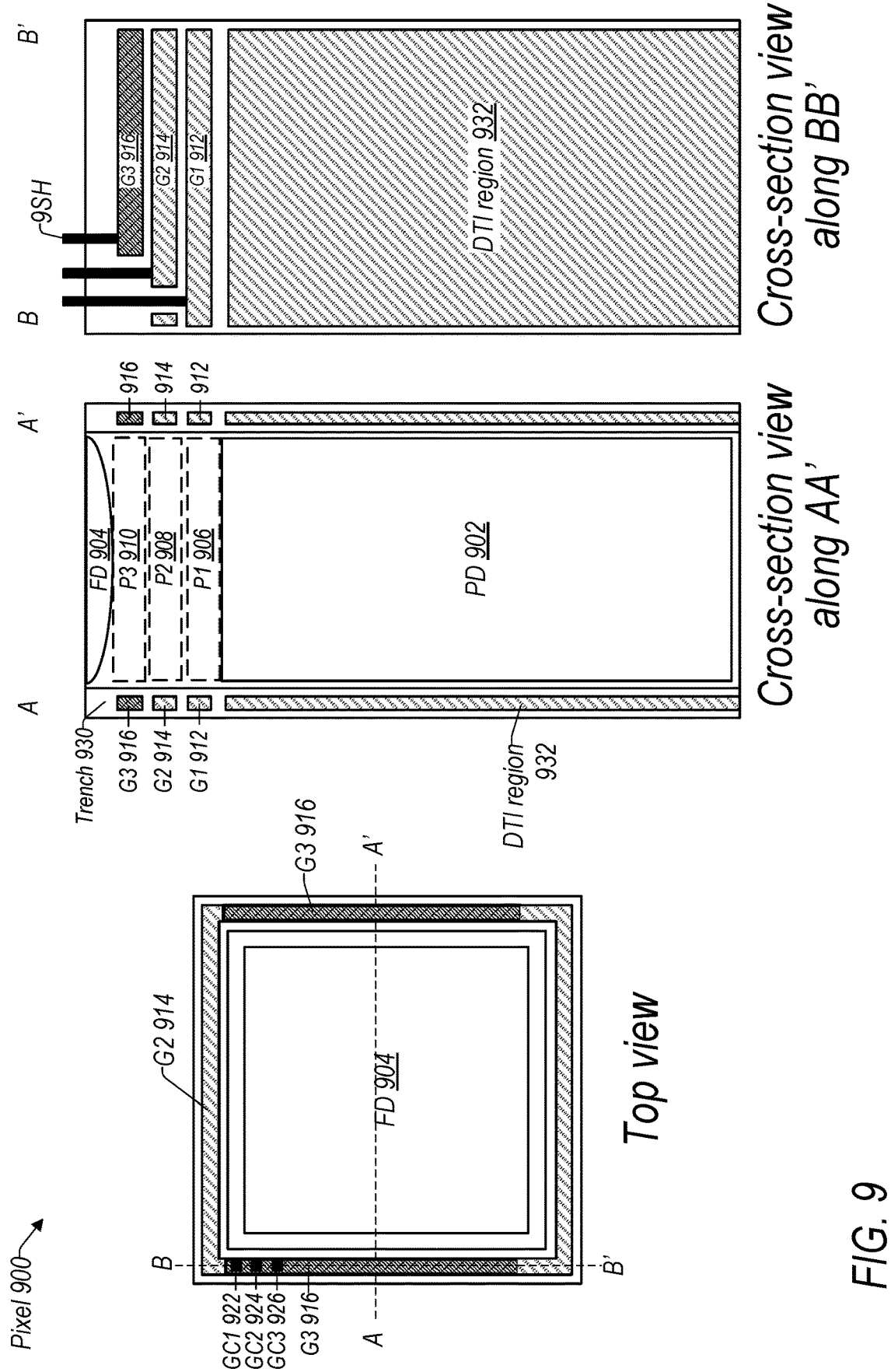
FIG. 9 shows top view and cross-section view of another example pixel of an image sensor, according to some embodiments.

FIG. 9 shows top view and cross-section view of another example pixel of an image sensor, according to some embodiments. As shown in FIG. 9, in some embodiments, the vertical gates and DTI isolation of a pixel may be formed in the same trench. For example, in some embodiments, gate areas of pixel 900, G1 912, G2 914, and G3 916, may be formed in the same trench 930 inside the substrate of pixel 900, as shown especially in the cross-sections of FIG. 9. G1 912, G2 914, and G3 916 may each receive a control signal (e.g., a control voltage) through an associated gate contact, e.g., GC1 922, GC2 924, and GC3, 926 respectively. Similar to what is described above in FIGS. 1-8, pixel 900 may include PD 902, FD 904, and a vertical charge transfer region between PD 902 and FD 904, and the vertical charge region may include multiple charge modulation regions P1 906, P2 908, and P3 910. In some embodiments, pixel 900 may be operated in a global shutter mode similarly as the above described pixels, where P2 908 may function as an in-pixel charge memory region for pixel 900.

Figure 10:
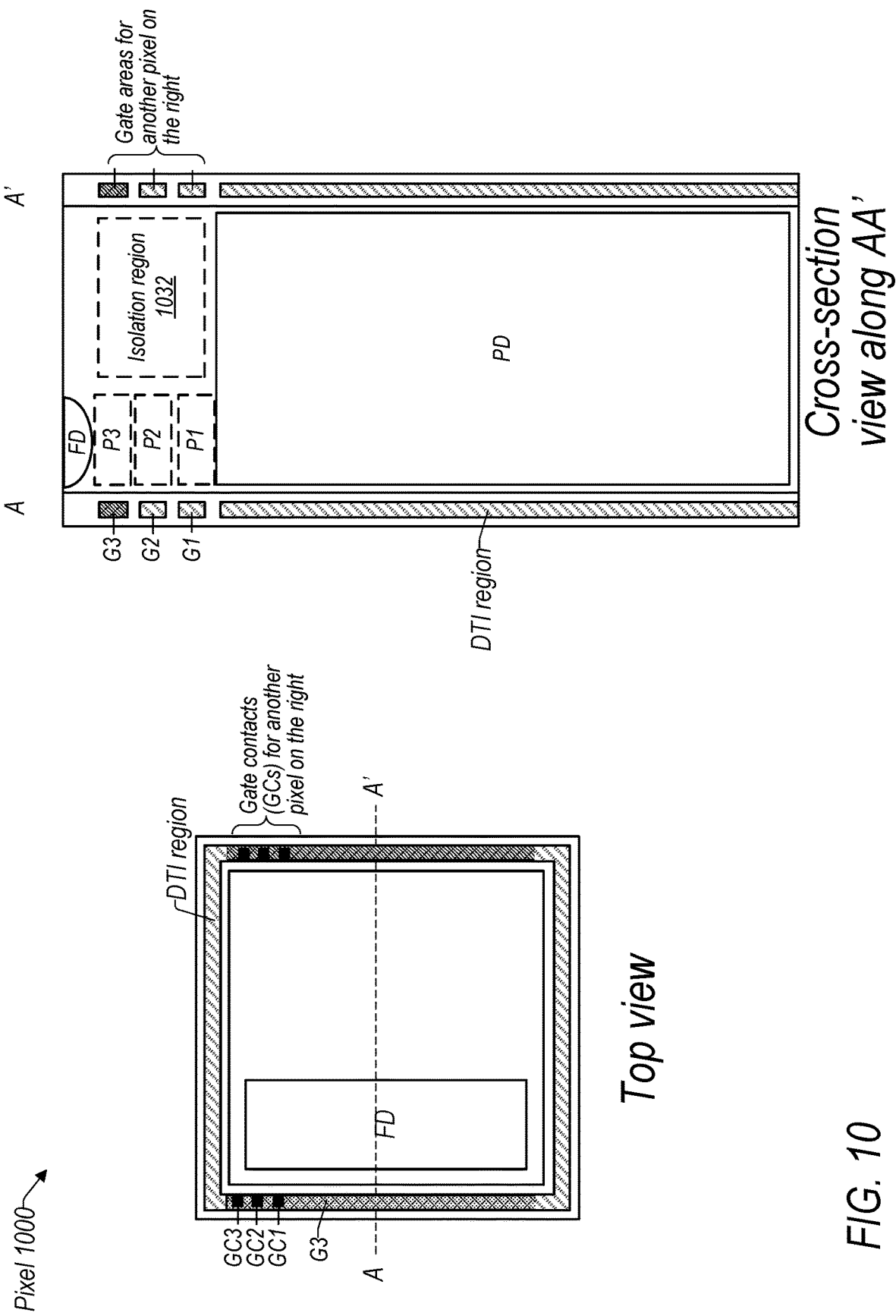
FIG. 10 shows top view and cross-section view of another example pixel of an image sensor, according to some embodiments.

FIG. 10 shows top view and cross-section view of another example pixel of an image sensor, according to some embodiments. As shown in FIG. 10, the structure of pixel 1000 may be similar to that of pixel 900. However, the P1, P2, P3, and FD regions of pixel 1000 may have smaller cross-section areas such that these regions only partially rather than completely overlapping the PD underneath PD region. In some embodiments, different doping concentrations in P1, P2, and P3 may be introduced by implants or other methods to create sufficient capacitance and facilitate the vertical charge transfer. As shown in FIG. 10, in some embodiments, there may be a set of gate areas for a neighbored pixel (not shown) on the right of pixel 1000, which are disposed in the trench proximate pixel 1000. Thus, in some embodiments, there may be isolation region 1032 between the gate areas (G1, G2, and G3) of pixel 1000 and the gate areas of the other pixel. In some embodiments, isolation region 1032 may be implanted with dopants to provide the isolation.

Figure 11:
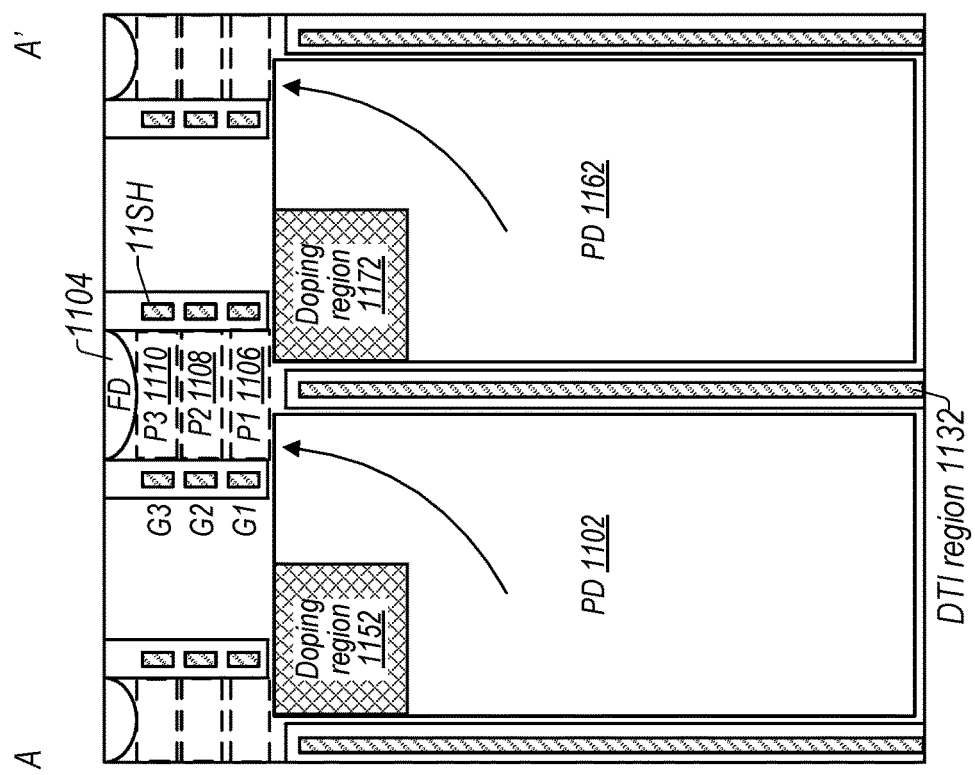
FIG. 11 shows top view and cross-section view of another example pixel of an image sensor, according to some embodiments.
Figure 11:
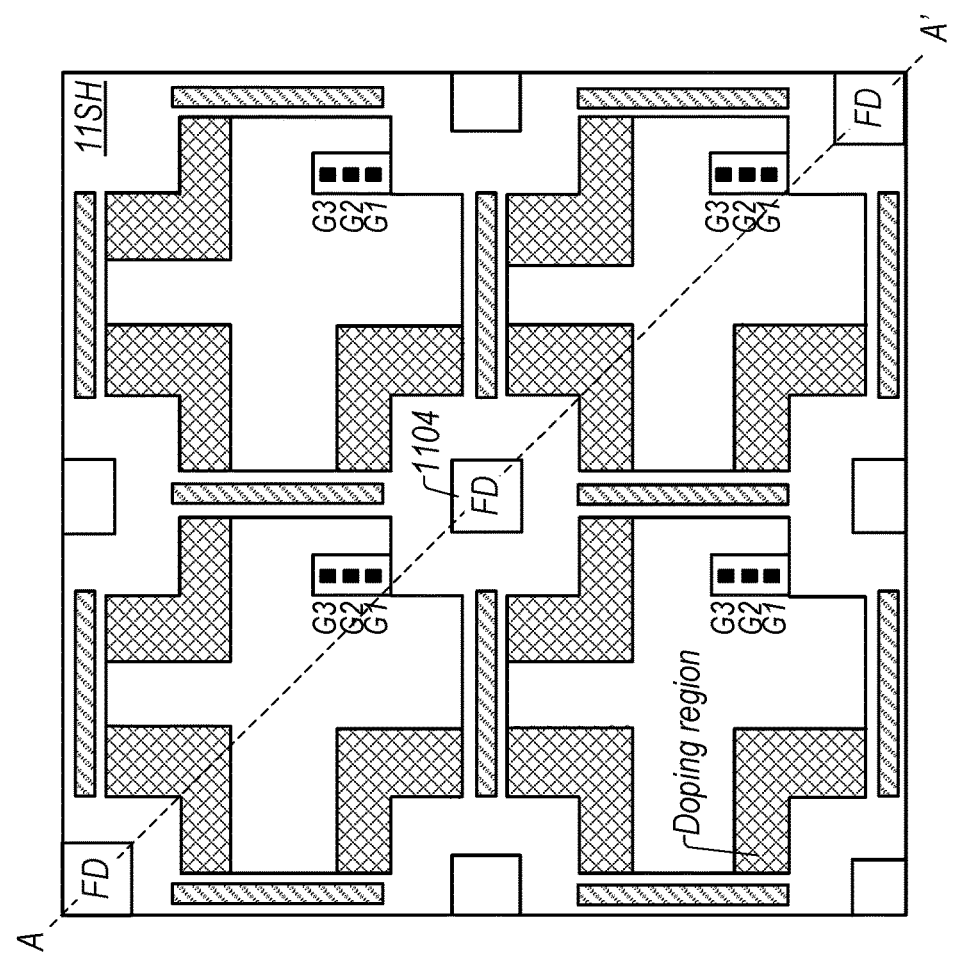

FIG. 11 shows top view and cross-section view of another example pixel of an image sensor, according to some embodiments. In this example, FD 1104, P1 1106, P2 1108, and P3 1110 may be moved to the corner of a pixel (e.g., for PD 1102), e.g., to the right corner of the pixel, as shown in the cross-section view of FIG. 11. In some embodiments, one performance parameter of a global shutter image sensor is parasitic light sensitivity (PLS), which quantifies the sensor sensitivity to light when the shutter is supposed closed. Thus, the image signals generated in this case may be considered the background noise. Thus, in some embodiments, it may be desired to minimize or at least reduce the value of PLS. By moving P1 1106, P2 1108, and P3 1110 to the corner of a pixel, DTI region 1132 may be used as the shield of incident light to reduce the amount of light going into P2 1108 to thus improve the PLS performance. In addition, in some embodiments, the pixel may include doping region 1152 to provide a potential barrier to prevent the charge from PD 1102 from being transferred to the P1, P2, P3, and FD at the left corner of the pixel (since those regions are for the pixel on the left). Instead, the charge of PD 1102 may be guided to be transferred correctly to FD 1104 via P1 1106, P2 1108, and P3 1110, as these regions correspond to PD 1102, as indicated by the left arrow in FIG. 11. Similarly, for the pixel on the right (e.g., for PD 1162), the pixel may also include doping region 1172 to block the charge from PD 1162 from being erroneously transferred from PD 1162 to P1 1106, P2 1108, P3 1110, and FD 1104. Instead, the charge of PD 1162 may be transferred to the FD via P1, P2, and P3 at the right corner of the right pixel, as indicated by the right arrow in FIG. 11. In some embodiments, the doping type of doping regions 1152 and 1172 may be opposite to the doping type of PD 1102 and PD 1162.

Figure 12:
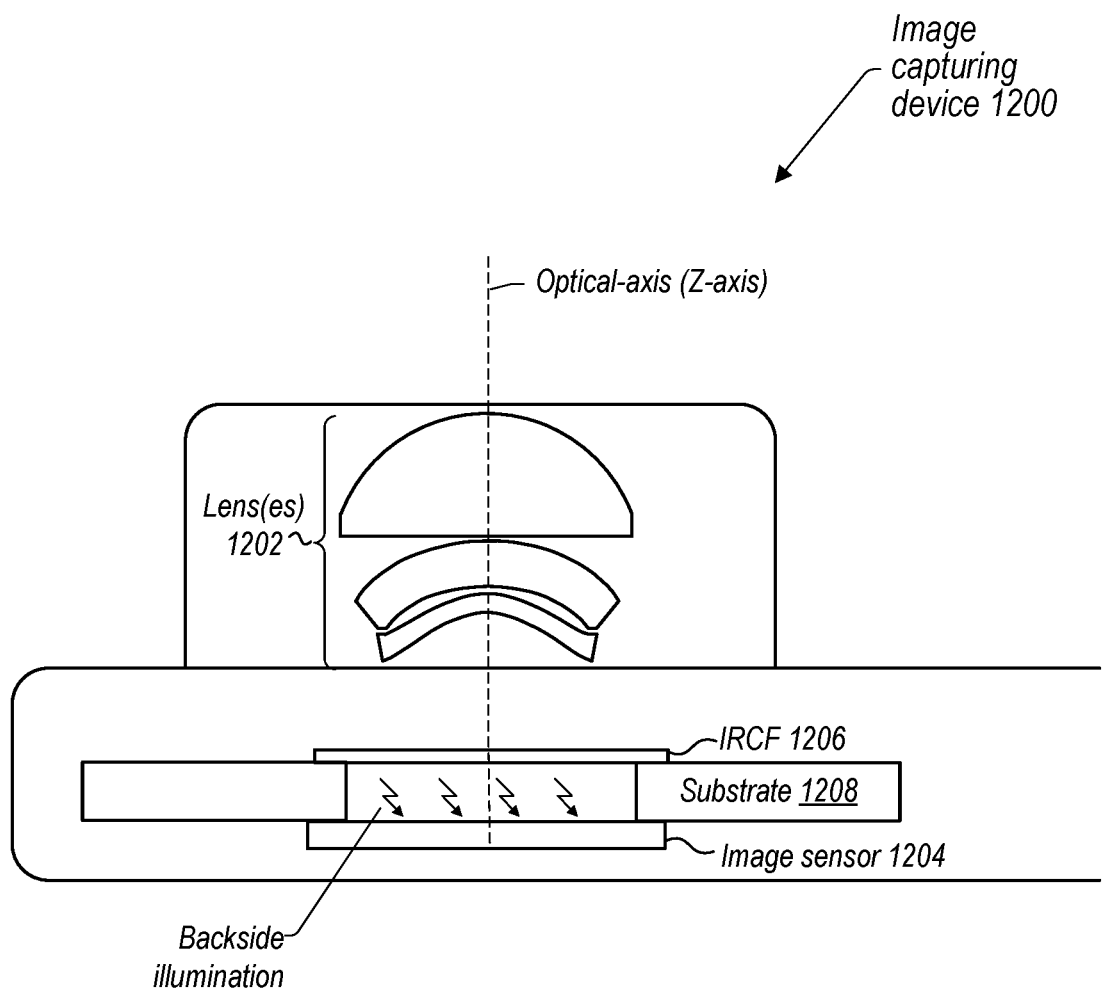
FIG. 12 is a block diagram of an example image capturing device, according to some embodiments.

FIG. 12 is a block diagram of an example image capturing device, according to some embodiments. As shown in FIG. 12, in some embodiments, image capturing device 1200 may include one or more lenses 1202 and image sensor 1204. In some embodiments, image capturing device 1200 may capture light from an environment, and the light may pass through lenses 1202 to reach image sensor 1204. In some embodiments, image sensor 1204 may include a plurality of pixels similar to the pixels described above, where each may include an in-pixel charge memory region for a global shutter operation. Also, in some embodiments, image capturing device 1200 may include infrared cutoff filter (IRCF) 1206 placed between lenses 1202 and image sensor 1204 to block infrared light from reaching image sensor 1204. As shown in FIG. 12, in this example, image sensor 1204 and IRCF 1206 may be mounted on substrate 1208, and image sensor 1204 may be placed upside down so as to receive backside illumination. But as described above, alternatively, in some embodiments, front side illumination may be implemented on image sensor 1204 having the above described pixels. In some embodiments, image sensor 204 may be a CMOS image sensor.

Figure 13:
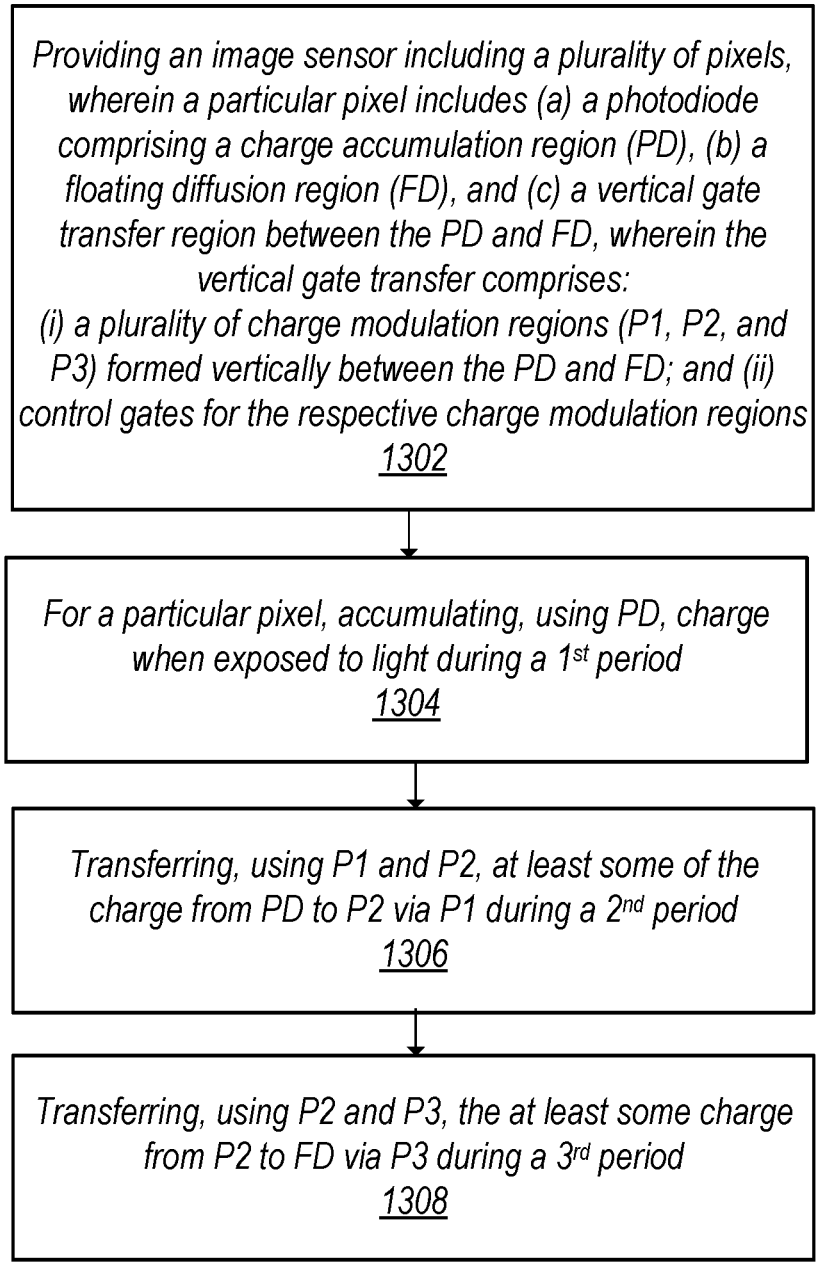
FIG. 13 is a flowchart showing an example method for using an in-pixel charge memory region to operate an image sensor in a global shutter mode, according to some embodiments.

FIG. 13 is a flowchart showing an example method for using an in-pixel charge memory region to operate an image sensor in a global shutter mode, according to some embodiments. As shown in FIG. 13, in some embodiments, an image sensor including a plurality of pixels may be provided, as indicated by block 1302. In some embodiments, each pixel of the image sensor may include (a) a photodiode comprising a charge accumulation region (PD), (b) a floating diffusion region (FD), and (c) a gate transfer region vertically between the PD and FD. In addition, in some embodiments, the vertical gate transfer region may further include (i) a plurality of charge modulation regions (P1, P2, and P3) formed vertically between the PD and FD; and (ii) control gates for the respective charge modulation regions. As shown in FIG. 13, in some embodiments, for a particular one of the pixels, the pixel may accumulate charge in its PD when exposed to light during a $1^{st}$ period, as indicated by block 1304. As described above, in some embodiments, the image sensor may operate in the global shutter mode, and thus all the pixels including the particular pixel may begin exposure and end exposure simultaneously during the first period. As shown in FIG. 13, in some embodiments, for the particular pixel, at least some of the charge of the PD may be transferred from the PD to P2 via P1 during a $2^{nd}$ period, as indicated by block 1306. As described above, in some embodiments, the transfer of charge from PD to P2 may be a global operation for all the pixels of the image sensor. In other words, all the pixels including the particular pixel may transfer their charge from PD to P2 simultaneously during the $2^{nd}$ period. In addition, as described above, in some embodiments, P2 may serve as an in-pixel charge memory region for the particular pixel. Thus, once the charge is transferred to P2, it may be temporarily stored there until the readout of the particular pixel. As shown in FIG. 13, in some embodiments, the charge transferred to P2 may further be transferred from P2 to FD via P1 during a $3^{rd}$ period, as indicated by block 1308. As described above, even in the global shutter mode, the individual pixels of the image sensor may not necessarily be read out simultaneously. Instead, the pixels may be read out line by line in sequence. Thus, the $3^{rd}$ period to transfer the charge from P2 to FD for the particular pixel may or may not be the same for the readout period of another pixel.

Figure 14:
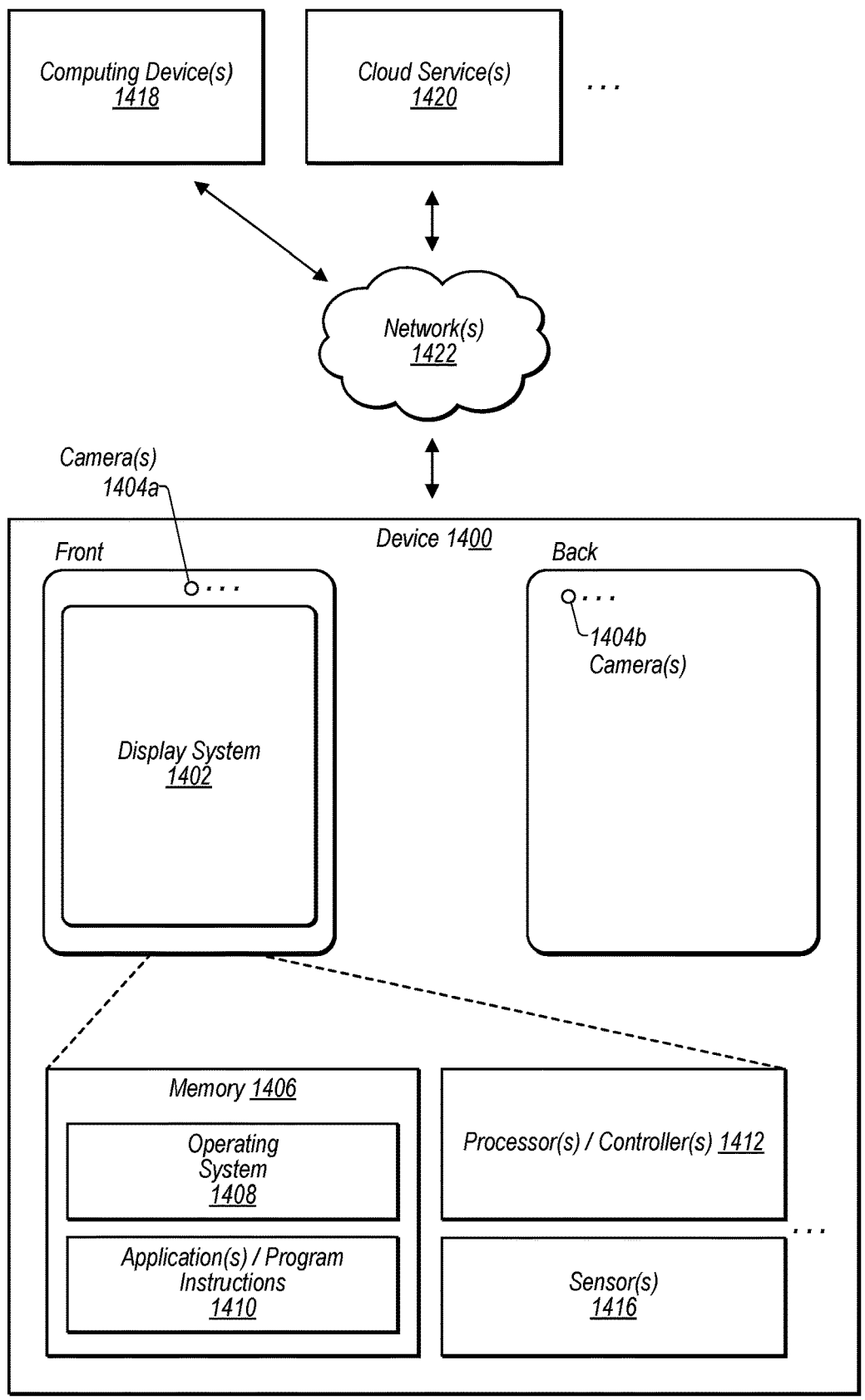
FIG. 14 illustrates a schematic representation of an example device that may include an image capturing device (e.g., a camera) having an image sensor that includes pixels with disclosed in-pixel charge memory regions, according to some embodiments.

FIG. 14 illustrates a schematic representation of an example device 1400 that may include an image capturing device (e.g., a camera) having an image sensor that includes pixels with the above described in-pixel charge memory regions, according to some embodiments. In some embodiments, the device 1400 may be a mobile device and/or a multifunction device. In various embodiments, the device 1400 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 1400 may include a display system 1402 (e.g., comprising a display and/or a touch-sensitive surface) and/or one or more cameras 1404. In some non-limiting embodiments, the display system 1402 and/or one or more front-facing cameras 1404*a* may be provided at a front side of the device 1400, e.g., as indicated in FIG. 14. Additionally, or alternatively, one or more rear-facing cameras 1404*b* may be provided at a rear side of the device 1400. In some embodiments comprising multiple cameras 1404, some or all of the cameras may be the same as, or similar to, each other. Additionally, or alternatively, some or all of the cameras may be different from each other. In various embodiments, the location(s) and/or arrangement(s) of the camera(s) 1404 may be different than those indicated in FIG. 14.

Among other things, the device 1400 may include memory 1406 (e.g., comprising an operating system 1408 and/or application(s)/program instructions 1410), one or more processors and/or controllers 1412 (e.g., comprising CPU(s), memory controller(s), display controller(s), and/or camera controller(s), etc.), and/or one or more sensors 1416 (e.g., orientation sensor(s), proximity sensor(s), and/or position sensor(s), etc.). In some embodiments, the device 1400 may communicate with one or more other devices and/or services, such as computing device(s) 1418, cloud service(s) 1420, etc., via one or more networks 1422. For example, the device 1400 may include a network interface (e.g., network interface 810) that enables the device 1400 to transmit data to, and receive data from, the network(s) 1422. Additionally, or alternatively, the device 1400 may be capable of communicating with other devices via wireless communication using any of a variety of communications standards, protocols, and/or technologies.

Figure 15:
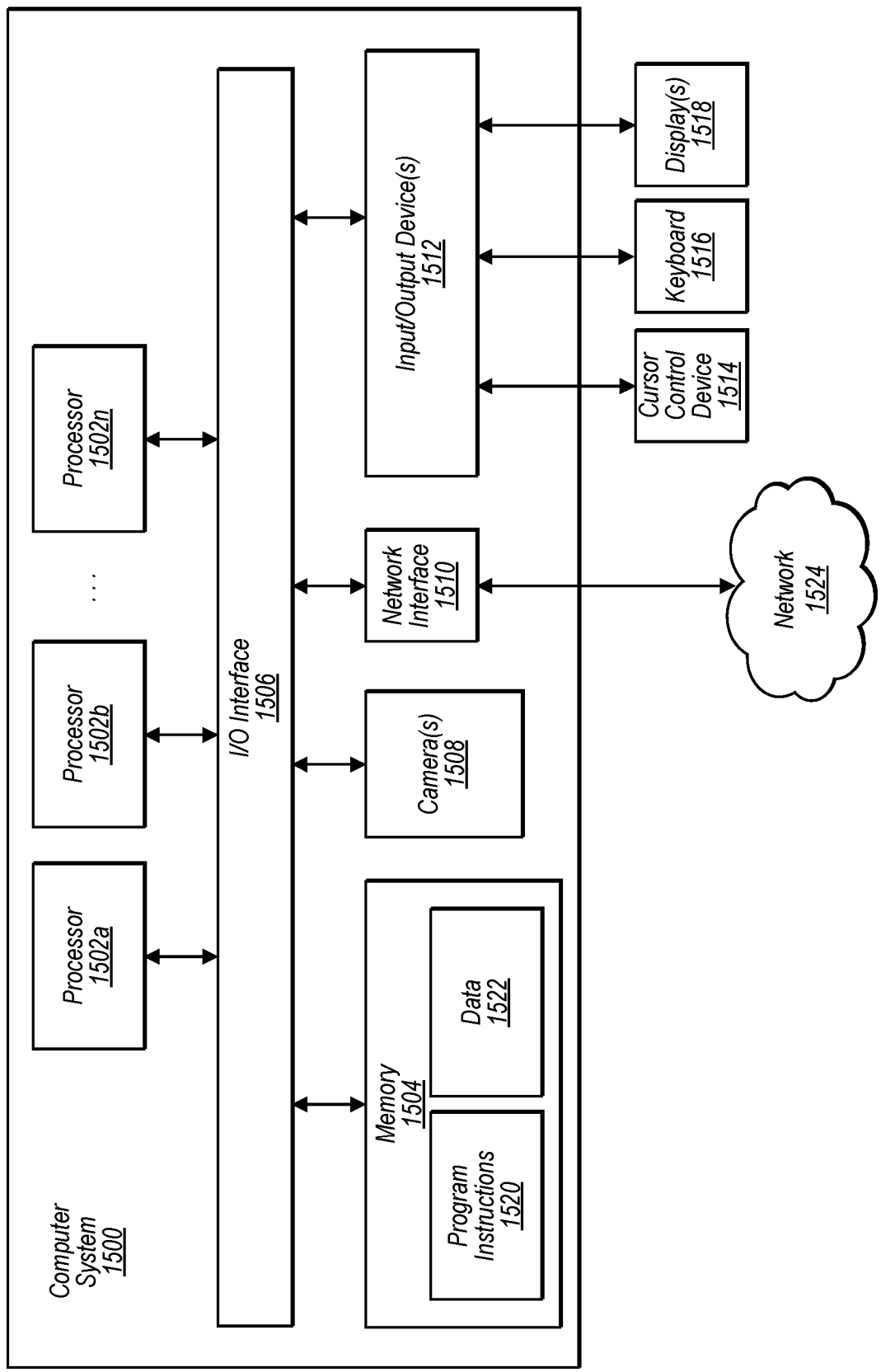
FIG. 15 illustrates a schematic block diagram of an example computing device, referred to as computer system, that may include or host embodiments of an image capturing device (e.g., a camera) having an image sensor that includes pixels with disclosed in-pixel charge memory regions, according to some embodiments.

FIG. 15 illustrates a schematic block diagram of an example computing device, referred to as computer system 1500, that may include or host embodiments of an image capturing device (e.g., a camera) having an image sensor that includes pixels with the above described in-pixel charge memory regions, according to some embodiments. In addition, computer system 1500 may implement methods for controlling operations of the camera and/or for performing image processing images captured with the camera. In some embodiments, the device 1400 (described herein with reference to FIG. 14) may additionally, or alternatively, include some or all of the functional components of the computer system 1500 described herein.

The computer system 1500 may be configured to execute any or all of the embodiments described above. In different embodiments, computer system 1500 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 1500 includes one or more processors 1502 coupled to a system memory 1504 via an input/output (I/O) interface 1506. Computer system 1500 further includes one or more cameras 1508 coupled to the I/O interface 1506. Computer system 1500 further includes a network interface 1510 coupled to I/O interface 1506, and one or more input/output devices 1512, such as cursor control device 1514, keyboard 1516, and display(s) 1518. In some cases, it is contemplated that embodiments may be implemented using a single instance of computer system 1500, while in other embodiments multiple such systems, or multiple nodes making up computer system 1500, may be configured to host different portions or instances of embodiments. For example, in one embodiment some elements may be implemented via one or more nodes of computer system 1500 that are distinct from those nodes implementing other elements.

In various embodiments, computer system 1500 may be a uniprocessor system including one processor 1502, or a multiprocessor system including several processors 1502 (e.g., two, four, eight, or another suitable number). Processors 1502 may be any suitable processor capable of executing instructions. For example, in various embodiments processors 1502 may be general-purpose or embedded processors implementing any of a variety of instruction set architectures (ISAs), such as the x86, PowerPC, SPARC, or MIPS ISAs, or any other suitable ISA. Also, in some embodiments, one or more of processors 1502 may include additional types of processors, such as graphics processing units (GPUs), application specific integrated circuits (ASICs), etc. In multiprocessor systems, each of processors 1502 may commonly, but not necessarily, implement the same ISA. In some embodiments, computer system 1500 may be implemented as a system on a chip (SoC). For example, in some embodiments, processors 1502, memory 1504, I/O interface 1506 (e.g. a fabric), etc. may be implemented in a single SoC comprising multiple components integrated into a single chip. For example, an SoC may include multiple CPU cores, a multi-core GPU, a multi-core neural engine, cache, one or more memories, etc. integrated into a single chip. In some embodiments, an SoC embodiment may implement a reduced instruction set computing (RISC) architecture, or any other suitable architecture.

System memory 1504 may be configured to store program instructions 1520 accessible by processor 1502. In various embodiments, system memory 1504 may be implemented using any suitable memory technology, such as static random access memory (SRAM), synchronous dynamic RAM (SDRAM), nonvolatile/Flash-type memory, or any other type of memory. Additionally, existing camera control data 1522 of memory 1504 may include any of the information or data structures to implement the techniques described above. In some embodiments, program instructions 1520 and/or data 1522 may be received, sent or stored upon different types of computer-accessible media or on similar media separate from system memory 1504 or computer system 1500. In various embodiments, some or all of the functionality described herein may be implemented via such a computer system 1500.

In one embodiment, I/O interface 1506 may be configured to coordinate I/O traffic between processor 1502, system memory 1504, and any peripheral devices in the device, including network interface 1510 or other peripheral interfaces, such as input/output devices 1512. In some embodiments, I/O interface 1506 may perform any necessary protocol, timing or other data transformations to convert data signals from one component (e.g., system memory 1504) into a format suitable for use by another component (e.g., processor 1502). In some embodiments, I/O interface 1506 may include support for devices attached through various types of peripheral buses, such as a variant of the Peripheral Component Interconnect (PCI) bus standard or the Universal Serial Bus (USB) standard, for example. In some embodiments, the function of I/O interface 1506 may be split into two or more separate components, such as a north bridge and a south bridge, for example. Also, in some embodiments some or all of the functionality of I/O interface 1506, such as an interface to system memory 1504, may be incorporated directly into processor 1502.

Network interface 1510 may be configured to allow data to be exchanged between computer system 1500 and other devices attached to a network 1524 (e.g., carrier or agent devices) or between nodes of computer system 1500. Network 1524 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1510 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1512 may, in some embodiments, include one or more display terminals, keyboards, keypads, touchpads, scanning devices, voice or optical recognition devices, or any other devices suitable for entering or accessing data by one or more computer systems 1500. Multiple input/output devices 1512 may be present in computer system 1500 or may be distributed on various nodes of computer system 1500. In some embodiments, similar input/output devices may be separate from computer system 1500 and may interact with one or more nodes of computer system 1500 through a wired or wireless connection, such as over network interface 1510.

Those skilled in the art will appreciate that computer system 1500 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1500 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1500 may be transmitted to computer system 1500 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. An image sensor, comprising:
a plurality of pixels, wherein each of the pixels comprises:
at least one photodiode comprising a charge accumulation region;
at least one floating diffusion region; and
at least one charge transfer region formed between the charge accumulation region and floating diffusion region, wherein the at least one charge transfer region is vertically below the at least one floating diffusion region,
wherein the charge transfer region includes a first charge modulation region, a second charge modulation region, and a third charge modulation region, and
wherein the pixel is controlled to:
accumulate charge in the charge accumulation region based on light exposure;
transfer at least some of the charge from the charge accumulation region to the second charge modulation region via the first charge modulation region; and
transfer the at least some charge from the second charge modulation region to the floating diffusion region via the third charge modulation region.

2. The image sensor of claim 1, wherein:
the first charge modulation region is formed above and at least partially overlapping the charge accumulation region of the photodiode;
the second charge modulation region formed above and at least partially overlapping the first charge modulation region;
the third charge modulation region formed above and at least partially overlapping the second charge modulation region; and
the floating diffusion region formed above and at least partially overlapping the third charge modulation region.

3. The image sensor of claim 1, wherein:
the first and second charge modulation regions are turned on to transfer the at least some charge from the charge accumulation region to the second charge modulation region via the first charge modulation region; and
the second and third charge modulation regions are turned on to transfer the at least some charge from the second charge modulation region to the floating diffusion region via the third charge modulation region.

4. The image sensor of claim 3, wherein:
the first, second, and third charge modulation regions are turned on responsive to respective positive voltages applied to respective gate control areas of the first, second, and third charge modulation regions; and
the first, second, and third charge modulation regions are turned off responsive to removal of the respective positive voltages from respective gate control areas of the first, second, and third charge modulation regions.

5. The image sensor of claim 4, wherein:
the first, second, and third charge modulation regions have a dopant of a same concentration, such that:
respective positive voltages of different values are applied to the respective gate control areas of the first and second charge modulation regions to create a stepped-potential profile between the first and second charge modulation regions to transfer the at least some charge from the charge accumulation region to the second charge modulation region via the first charge modulation region; and
respective positive voltages of different values are applied to the respective gate control areas of the second and third charge modulation regions to create a stepped-potential profile between the second and third charge modulation regions to transfer the at least some charge from the second charge modulation region to the floating diffusion region via the third charge modulation region.

6. The image sensor of claim 4, wherein:
the first, second, and third charge modulation regions have a dopant of different concentrations so as to create stepped-potential profiles between the first, second, and third charge modulation regions, such that:
respective positive voltages of a same value are applied to the respective gate control areas of the first and second charge modulation regions to maintain the stepped-potential profile between the first and second charge modulation regions to transfer the at least some charge from the charge accumulation region to the second charge modulation region via the first charge modulation region; and
respective positive voltages of a same value are applied to the respective gate control areas of the second and third charge modulation regions to maintain the stepped-potential profile between the second and third charge modulation regions to transfer the at least some charge from the second charge modulation region to the floating diffusion region via the third charge modulation region.

7. The image sensor of claim 4, wherein the respective gate control areas of the first, second, and third charge modulation regions are formed in a shape to at least partially encircle a lateral perimeter of the floating diffusion region.

8. The image sensor of claim 1, wherein:
the plurality of pixels is organized as a pixel array to divide the pixels into multiple rows and multiple columns; and
the plurality of pixels is controlled to operate in a global shutter mode, such that:
pixels of the multiple rows and multiple columns accumulate charge in their respective charge accumulation regions based on light exposure simultaneously;
pixels of the multiple rows and multiple columns transfer at least some of the charge from their respective charge accumulation regions to their respective second charge modulation regions via their respective first charge modulation regions simultaneously;
pixels of same rows transfer the at least some charge from their respective second charge modulation regions to their respective floating diffusion regions via their respective third charge modulation regions simultaneously; and
pixels of different rows transfer the at least some charge from their respective second charge modulation regions to their respective floating diffusion regions via their respective third charge modulation regions sequentially in order of the rows.

9. The image sensor of claim 1, wherein the charge accumulation region is a n-type region, the first, second, and third charge modulation regions are p-type regions, and the floating diffusion region is a n-type region.

10. The image sensor of claim 1, wherein the pixel further comprises pixel readout circuitry including at least one of: a reset switch for resetting a voltage of the floating diffusion region to a reset voltage, a source follower switch for buffering the voltage of the floating diffusion region, or a pixel selection switch for selectively coupling the floating diffusion region to a pixel output line for reading out the voltage of the floating diffusion region.

11. A system, comprising:
one or more lenses;
an image sensor comprising:
a plurality of pixels configured to receive light through the lenses, wherein each of the pixels comprises:
at least one photodiode comprising a charge accumulation region;
at least one floating diffusion region; and
at least one charge transfer region formed between the charge accumulation region and floating diffusion region,
wherein the at least one charge transfer region is vertically below the at least one floating diffusion region,
wherein the charge transfer region includes a first charge modulation region, a second charge modulation region, and a third charge modulation region, and
wherein the pixel is controlled to:
accumulate charge in the charge accumulation region based on light exposure;
transfer at least some of the charge from the charge accumulation region to the second charge modulation region via the first charge modulation region; and
transfer the at least some charge from the second charge modulation region to the floating diffusion region via the third charge modulation region to generate an image signal at the floating diffusion region; and
circuitry to read out image signals from the plurality of pixels.

12. The system of claim 11, wherein:
the first charge modulation region is formed above and at least partially overlapping the charge accumulation region of the photodiode;
the second charge modulation region formed above and at least partially overlapping the first charge modulation region;
the third charge modulation region formed above and at least partially overlapping the second charge modulation region; and the floating diffusion region formed above and at least partially overlapping the third charge modulation region.

13. The system of claim 11, wherein:
the first and second charge modulation regions are turned on to transfer the at least some charge from the charge accumulation region to the second charge modulation region via the first charge modulation region; and
the second and third charge modulation regions are turned on to transfer the at least some charge from the second charge modulation region to the floating diffusion region via the third charge modulation region.

14. The system of claim 13, wherein:
the first, second, and third charge modulation regions are turned on responsive to respective positive voltages applied to respective gate control areas of the first, second, and third charge modulation regions; and
the first, second, and third charge modulation regions are turned off responsive to removal of the respective positive voltages from respective gate control areas of the first, second, and third charge modulation regions.

15. The system of claim 14, wherein:
the first, second, and third charge modulation regions have a dopant of a same concentration, such that:
respective positive voltages of different values are applied to the respective gate control areas of the first and second charge modulation regions to create a stepped-potential profile between the first and second charge modulation regions to transfer the at least some charge from the charge accumulation region to the second charge modulation region via the first charge modulation region; and
respective positive voltages of different values are applied to the respective gate control areas of the second and third charge modulation regions to create a stepped-potential profile between the second and third charge modulation regions to transfer the at least some charge from the second charge modulation region to the floating diffusion region via the third charge modulation region.

16. The system of claim 14, wherein:
the first, second, and third charge modulation regions have a dopant of different concentrations so as to create stepped-potential profiles between the first, second, and third charge modulation regions, such that:
respective positive voltages of a same value are applied to the respective gate control areas of the first and second charge modulation regions to maintain the stepped-potential profile between the first and second charge modulation regions to transfer the at least some charge from the charge accumulation region to the second charge modulation region via the first charge modulation region; and
respective positive voltages of a same value are applied to the respective gate control areas of the second and third charge modulation regions to maintain the stepped-potential profile between the second and third charge modulation regions to transfer the at least some charge from the second charge modulation region to the floating diffusion region via the third charge modulation region.

17. The system of claim 11, wherein:
the plurality of pixels is organized as a pixel array to divide the pixels into multiple rows and multiple columns; and
the plurality of pixels is controlled to operate in a global shutter mode, such that:
pixels of the multiple rows and multiple columns accumulate charge in their respective charge accumulation regions based on light exposure simultaneously;
pixels of the multiple rows and multiple columns transfer at least some of the charge from their respective charge accumulation regions to their respective second charge modulation regions via their respective first charge modulation regions simultaneously;
pixels of same rows transfer the at least some charge from their respective second charge modulation regions to their respective floating diffusion regions via their respective third charge modulation regions simultaneously; and
pixels of different rows transfer the at least some charge from their respective second charge modulation regions to their respective floating diffusion regions via their respective third charge modulation regions sequentially in order of the rows.

18. A device, comprising:
an image capturing device, comprising:
one or more lenses;
an image sensor comprising:
a plurality of pixels configured to receive light through the lenses, wherein each of the pixels comprises:
at least one photodiode comprising a charge accumulation region;
at least one floating diffusion region; and
at least one charge transfer region formed between the charge accumulation region and floating diffusion region, wherein the at least one charge transfer region is vertically below the at least one floating diffusion region,
wherein the charge transfer region includes a first charge modulation region, a second charge modulation region, and a third charge modulation region, and
wherein the pixel is controlled to:
accumulate charge in the charge accumulation region based on light exposure;
transfer at least some of the charge from the charge accumulation region to the second charge modulation region via the first charge modulation region; and
transfer the at least some charge from the second charge modulation region to the floating diffusion region via the third charge modulation region to generate an image signal at the floating diffusion region; and
circuitry to read out image signals from the plurality of pixels; and
an image signal processor configured to process the image signals to produce one or more images.

19. The device of claim 18, wherein:
the first charge modulation region is formed above and at least partially overlapping the charge accumulation region of the photodiode;
the second charge modulation region formed above and at least partially overlapping the first charge modulation region;
the third charge modulation region formed above and at least partially overlapping the second charge modulation region; and
the floating diffusion region formed above and at least partially overlapping the third charge modulation region.

20. The device of claim 18, wherein:

the plurality of pixels is organized as a pixel array to divide the pixels into multiple rows and multiple columns; and the plurality of pixels is controlled to operate in a global shutter mode, such that:
- pixels of the multiple rows and multiple columns accumulate charge in their respective charge accumulation regions based on light exposure simultaneously;
- pixels of the multiple rows and multiple columns transfer at least some of the charge from their respective charge accumulation regions to their respective second charge modulation regions via their respective first charge modulation regions simultaneously;
- pixels of same rows transfer the at least some charge from their respective second charge modulation regions to their respective floating diffusion regions via their respective third charge modulation regions simultaneously; and
- pixels of different rows transfer the at least some charge from their respective second charge modulation regions to their respective floating diffusion regions via their respective third charge modulation regions sequentially in order of the rows.

* * * * *